United States Patent
Hjartarson et al.

(10) Patent No.: US 12,272,925 B2
(45) Date of Patent: Apr. 8, 2025

(54) VERTICALLY INTEGRATED ELECTRO-ABSORPTION MODULATED LASERS AND METHODS OF FABRICATION

(71) Applicant: ElectroPhotonic-IC Inc., Kanata (CA)

(72) Inventors: Gudmundur A. Hjartarson, Ottawa (CA); William A. Hagley, Ottawa (CA); Lawrence E. Tarof, Kanata (CA)

(73) Assignee: ElectroPhotonic-IC Inc., Kanata (CA)

( * ) Notice: Subject to any disclaimer, the term of this patent is extended or adjusted under 35 U.S.C. 154(b) by 583 days.

(21) Appl. No.: 17/687,803

(22) Filed: Mar. 7, 2022

(65) Prior Publication Data

US 2022/0190550 A1 Jun. 16, 2022

Related U.S. Application Data

(63) Continuation-in-part of application No. PCT/CA2020/051562, filed on Nov. 17, 2020.
(Continued)

(51) Int. Cl.
*H01S 5/026* (2006.01)
*G02B 6/122* (2006.01)
(Continued)

(52) U.S. Cl.
CPC .......... *H01S 5/0265* (2013.01); *G02B 6/1228* (2013.01); *H01S 5/0014* (2013.01);
(Continued)

(58) Field of Classification Search
CPC .... H01S 5/0265; H01S 5/0014; H01S 5/0208; H01S 5/1014; H01S 5/1231; H01S 5/22;
(Continued)

(56) References Cited

U.S. PATENT DOCUMENTS 6,483,863 B2  11/2002  Forrest et al.
6,542,525 B1   4/2003  Matsumoto et al.
(Continued)

FOREIGN PATENT DOCUMENTS

WO   2013185218 A1   12/2013

OTHER PUBLICATIONS

International Search Report issued on related International Application No. PCT/CA2020/051562; Jan. 11, 2021; 2 pages.
(Continued)

*Primary Examiner* — Yuanda Zhang
(74) *Attorney, Agent, or Firm* — Miltons IP/p.i.

(57) ABSTRACT

Electro-absorption modulators (EAM) and monolithically integrated electro-absorption modulated lasers (EML) and methods of fabrication are disclosed. Vertically stacked waveguides for a distributed feedback (DFB) laser, an electro-absorption modulator (EAM) and a passive output waveguide are vertically integrated, and the DFB laser, EAM and output waveguide are optically coupled using laterally tapered vertical optical couplers. Laterally tapered vertical optical couplers provides an alternative to conventional butt-coupling of a laser and EAM, offering improved reliability for high power operation over extended lifetimes. Optionally, the EML comprises monolithically integrated electronic circuitry, e.g., driver and control electronics for the DFB laser and EAM. Beneficially, integrated EAM driver and control circuitry comprises a high-speed electro-optical control loop for very high-speed linearization and temperature compensation, e.g. to enable advanced modulation schemes, such as PAM-4 and DP-QPSK, for analog optical data center interconnect applications. Some embodiments are compatible with fabrication using a single epitaxial growth.

18 Claims, 16 Drawing Sheets

Related U.S. Application Data

(60) Provisional application No. 62/936,629, filed on Nov. 18, 2019.

(51) Int. Cl.

| | |
|---|---|
| *H01S 5/00* | (2006.01) |
| *H01S 5/02* | (2006.01) |
| *H01S 5/10* | (2021.01) |
| *H01S 5/12* | (2021.01) |
| *H01S 5/22* | (2006.01) |
| *H01S 5/323* | (2006.01) |

(52) U.S. Cl.
CPC .......... *H01S 5/0208* (2013.01); *H01S 5/1014* (2013.01); *H01S 5/1231* (2013.01); *H01S 5/22* (2013.01); *H01S 5/32391* (2013.01); *H01S 5/026* (2013.01); *H01S 5/12* (2013.01)

(58) Field of Classification Search
CPC ........ H01S 5/32391; H01S 5/026; H01S 5/12; G02B 6/1228
See application file for complete search history.

(56) References Cited

U.S. PATENT DOCUMENTS

| | | | |
|---|---|---|---|
| 7,120,183 B2 | 10/2006 | Krasulick et al. | |
| 7,444,055 B2 | 10/2008 | Tolstikhin et al. | |
| 7,476,558 B2 | 1/2009 | Zhu et al. | |
| 7,809,038 B2 | 10/2010 | Makino | |
| 10,530,484 B2 | 1/2020 | Hjartarson et al. | |
| 10,673,532 B2 | 6/2020 | Hjartarson et al. | |
| 2002/0097941 A1 | 7/2002 | Forrest et al. | |
| 2007/0077017 A1* | 4/2007 | Menon | H01S 5/162 |
| | | | 359/344 |
| 2007/0223543 A1 | 9/2007 | Prosyk et al. | |
| 2008/0013881 A1* | 1/2008 | Welch | G02B 6/12004 |
| | | | 385/14 |
| 2008/0080808 A1* | 4/2008 | Tolshikhin | G02B 6/1228 |
| | | | 257/E31.022 |
| 2010/0290489 A1 | 11/2010 | Agresti et al. | |
| 2012/0106583 A1 | 5/2012 | Watson et al. | |
| 2019/0238234 A1 | 8/2019 | Hjartarson et al. | |
| 2019/0252861 A1* | 8/2019 | Watson | H01S 5/1231 |

OTHER PUBLICATIONS

M. Trajkovic, Phd thesis, "High speed electro-absorption modulators in indium phosphide generic integration technologies" May 16, 2019 Research output: Thesis > Phd Thesis 1 (Research TU/e / Graduation TU/e).

M. Trajkovic, F. Blache, H. Debregeas, K. A. Williams and X. J. M. Leijtens, "Increasing the Speed of an InP-Based Integration Platform by Introducing High Speed Electroabsorption Modulators," in IEEE Journal of Selected Topics in Quantum Electronics, vol. 25, No. 5, pp. 1-8, Sep.-Oct. 2019, Art No. 3400208, doi: 10.1109/JSTQE.2019.2913727.

Alyabyeva, L.N., Zhukova, E.S., Belkin, M.A et al. Dielectric properties of semi-insulating Fe-doped InP in the terahertz spectral region. Sci Rep 7, 7360 (2017).https://doi.org/10.1038/s41598-017-07164-1; https://www.nature.com/articles/s41598-017-07164-1.

Wei Shi et al. Silicon photonic modulators for PAM transmissions; IOP Journal of Optics, (vol. 20, Issue 8) 2018.

J. Piprek, et al. , High-Efficiency MQW Electroabsorptions Modulators, Integrated Optoelecronics: Proceedings of the First International Symposium 2002; https://web.ece.ucsb.edu>papers>piprek02ecs.

V. I. Tolstikhin, et al., One-Step Growth Optical Transceiver PIC in InP, ECOC 2009, Sep. 20-24, 2009, Vienna Austria paper 8.6.2.

Francisco M. Soares, et al., InP-based Foundry PICs for Optical Interconnects, Appl. Sci. 2019, 9, 1588;doi:10.3390app9081588;www.mdpi.com/journal/applsci.

Patrick Runge et al., InP—Components for 100GBaud Optical Data Center Communications, Photonics 2021, 8, 18, https://doi.org/10.3390/photonics 8010018 https://www..mdpi.com/journal/photonics.

* cited by examiner 300-1

Growth of epi-stack for electronics 300-2

Provide spacer layer(s) with etch stop 300-3

Blanket growth of MGVI epi-stack 300-4

Mask island areas for photonics

Remove (etch back) MGVI epi-stack from island areas for electronics

Process electronic circuitry (excluding 2$^{nd}$ level interconnect)

300-5

Process laser, EAM from top down while protecting electronic circuitry 300-6

Back-end metallization and interconnect with planarization and post-processing 400-1

400-2

Integrated EML – schematic plan view with integrated driver circuitry

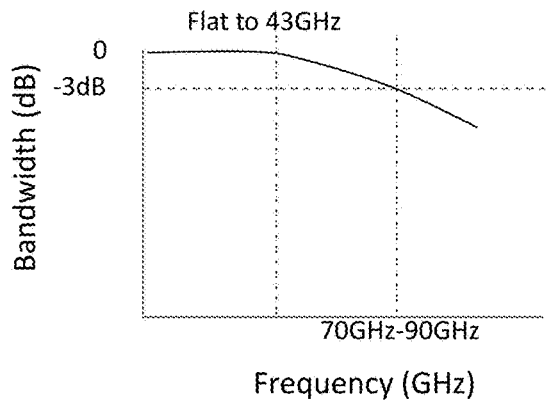

Fig. 19

| Feature | EML using conventional multiple-growth and butt-coupling of laser diode and modulator | Vertically coupled EML of example embodiments | Advantages of vertically coupled EML on SI substrate |
|---|---|---|---|
| Substrate | N++ | Semi-insulating (SI) | Diode isolation; high breakdown voltages allow higher drive levels; very low capacitance. |
| Growth | Multiple | Single | High reliability; no early life failure; burn-in not required. |
| Electrical Path through etched/re-grown material | Yes | No | Virgin crystalline structure; avoids defects, e.g. dislocations that act as failure points. |
| Optical Path through etched/re-grown material | Yes | No | Virgin crystalline structure; avoids defects, e.g. dislocations that act as failure points. |
| Speed | 30-38 GHz | 70-90 GHz | Low capacitance leads to very high speeds; e.g. very good for 112G PAM-4 (224 Gb/s). |
| Diode isolation | No | Yes | Can eliminate negative bias supply; allows for differential drive. |
| Extinction ratio | ~6-7 dB | >7 dB | High extinction ratio; reduced transmission error rates. |
| Ability to integrate the driver | No | Yes | Lowers power consumption; improves costs and yields. |

Fig. 20

VERTICALLY INTEGRATED ELECTRO-ABSORPTION MODULATED LASERS AND METHODS OF FABRICATION

CROSS-REFERENCE TO RELATED APPLICATIONS

This application is a Continuation-in-Part of PCT International Patent application no. PCT/CA2020/051562, filed Nov. 17, 2020, designating the United States, entitled "VERTICALLY INTEGRATED ELECTRO-AB SORPTION MODULATED LASERS AND METHODS OF FABRICATION", which claims priority from U.S. provisional patent application No. 62/936,629, filed Nov. 18, 2019 entitled "Vertically Integrated Electro-Absorption Modulated Lasers and Methods of Fabrication", both of which are incorporated herein by reference in its entirety. This application is related to U.S. patent application Ser. No. 16/708,887, filed Dec. 10, 2019, entitled "Electro-Absorption Modulator with Integrated Control Loop for Linearization and Temperature Compensation", which is a continuation-in-part of U.S. patent application Ser. No. 16/263,169, filed Jan. 31, 2019, entitled "Integrated Control Loop for Linearization and Temperature Compensation of an Electro-Absorption Modulator", which claims priority from U.S. provisional patent application Ser. No. 62/625,311, filed Feb. 1, 2018, of the same title; these applications are incorporated herein by reference in their entirety.

TECHNICAL FIELD

The present invention relates to the field of integrated photonics, photonic integrated circuits (PICs) based on III-V compound semiconductor materials, and more particularly to electro-absorption modulators (EAM) and integrated electro-absorption modulated lasers (EML), for applications such as high speed optical data center interconnect and next generation Gigabit Passive Optical Networks (GPON).

BACKGROUND

There is an increasing demand for high-speed optical transmitters and receivers capable of high performance modulation, for applications such as ≥100 Gb/s data center interconnect and next generation (GPON). Currently, some of the available solutions are not optimized for ≥100 Gb/s interconnect, and/or suffer from performance and reliability issues.

Electro-absorption modulators (EAM) are commonly used in the fiber optics world as external modulators of light output from continuous wave lasers. For example, an EAM can be used with an inexpensive slow laser for a high-performance application, i.e. transmitting at data rates limited, not by the characteristics of the laser, but by the characteristics of the EAM. An assembly of a laser and an EAM is known as an electro-absorption modulated laser (EML).

Conventional EML assemblies may be made with discrete components, i.e. a separately fabricated DFB laser chip and a EAM chip, which may comprise different semiconductor materials. The laser and the EAM are butt-coupled on a common substrate, and requires cooling, e.g. is back-side cooled with a thermoelectric cooler (TEC). Butt-coupling may be achieved, for example, by directly fusing facets of the DFB laser and the EAM, or bonding the facets with an encapsulant or bonding material. However, in EML assemblies of these types of structures, the interface region between the DFB laser and EAM components, particularly when fabricated from semiconductor materials having different crystalline compositions, is a region of high-stress and strain, e.g., due to lattice mismatch, different temperature coefficients of expansion (CTE), and other inherently different characteristics as a function of operating conditions. Thus, these EML assemblies typically have a very narrow operating temperature range, e.g. ~1 C, even when cooled. For some EML assemblies, it has been reported that reliable operation is limited to ~2000 hrs and failures may occur at <3000 hrs.

In principle, monolithic integration of optical waveguide devices having different waveguide core regions and functions can be achieved in one of the following ways:
a) direct butt-coupling: multiple steps of epitaxial growth, with selective area etching and re-growth, are used to provide the required semiconductor layers for each waveguide device, which are laterally coupled through a common horizontal optical plane on a PIC die;
b) modified butt-coupling: growth of single epitaxial layer stack, with selective area post-growth modification form regions to each waveguide device, which are laterally coupled through a common horizontal optical plane on as PIC die; and
c) evanescent-field coupling: an epitaxial layer stack defines vertically stacked waveguide devices which are vertically coupled through resonant or non-resonant evanescent field coupling.

By way of example, device structures for monolithically integrated EML using direct butt-coupling or modified butt-coupling are described in:
U.S. Pat. No. 7,120,183 to Krasulick et al., issued Oct. 10, 2006, entitled "Electro-absorption modulated laser with high operating temperature tolerance";
U.S. Pat. No. 7,809,038 to Makino, issued Oct. 5, 2010, entitled "Electro-absorption modulator integrated with a laser to produce long distance, low power 1550 nm optical device with optimized parameters";
U.S. Pat. No. 7,476,558 issued Jan. 13, 2009, entitled "Method for manufacturing selective area grown stacked-layer electro-absorption modulated laser structure";
U.S. Pat. No. 7,476,558 to Zhu, issued Jan. 13, 2009, entitled "Method for manufacturing selective area grown stacked-layer electro-absorption modulated laser structure";
United States Patent publication No. US2010/0290489 to Agresti, published Nov. 18, 2010, entitled "Electro-absorption modulated laser (EML) assembly having a ¼ wavelength phase shift located in the forward portion of the distributed feedback DFB of the EML assembly, and a method";
PCT International Patent publication No. WO2018/091094A1 to Moehrle, published May 24, 2018, entitled "Method for fabricating and electro-absorption modulated laser and electro-absorption modulated laser".

Fabrication of multi-guide vertical integration (MGVI) structures, which are based on non-resonant evanescent field vertical coupling are described, for example, in:
PCT International Patent publication No. WO2013/185218A1 to Tolstikhin, published Dec. 19, 2013, entitled "Space-Wavelength Division Multiplexing Transmitter and Receiver Photonic Integrated Circuits".

In most applications of EAMs to date, the modulator and the electronics driving the modulator are separate chips mounted on a common substrate and interconnected by a matched impedance strip-line circuit. At the speeds where EAMs are typically used, a matched impedance drive circuit is required, unless the interconnect length is much less than a wavelength. Commonly available packaging approaches do not meet this requirement and matched impedance interconnect is needed. However, use of a matched impedance strip-lines results in significant power loss, i.e. loss of half of the drive voltage due to the matched impedances. For a typical EAM drive voltage, which is in the order of 2 Volts, and an impedance of 50 Ohms, the drive power is quite high, because of the low impedance. To reduce power loss and improved performance, there is a need for alternative solutions that eliminate the need for matched impedance strip-lines.

Another issue is that EAMs are non-linear, temperature dependent and wavelength dependent. As such, they are normally used in applications where the modulation of the light is simple on-off modulation. Analog modulation schemes for high performance applications, such as optical data center interconnects, use other types of modulators, such as Mach-Zehnder (MZ) modulators. MZ modulators are typically larger, costlier and require a digital signal processor (DSP) or other methods to compensate for their sinusoidal modulation function. Where EAMs are used for modulation, it is known to resort to simple manual tuning of each device to select the most linear region of operation. High performance modulation, e.g. PAM4, may not be achievable with currently available, low cost, emitters, with discrete driver and control electronics.

For some applications, currently available lasers, either directly modulated or EML, do not provide sufficient optical output power for longer distance optical interconnect, which necessitates use of more sensitive avalanche photo-diode detectors, which are expensive and have poorer long-term reliability. Higher power output lasers are needed to allow for use of receivers comprising low cost, reliable PIN diode detectors.

Accordingly, there is a need for improved EAM and monolithically integrated EML which address at least one of the above-mentioned issues of performance, output power, reliability, linearization and temperature compensation, et al. For example, there is a need for improvements to integrated EML to address requirements of applications such as >100 Gb/s data center interconnect and next generation GPON.

SUMMARY OF INVENTION

The present invention seeks to eliminate or mitigate one or more of the above-mentioned disadvantages of known devices and systems comprising EAM and EML, or at least provide an alternative.

Aspects of the invention provides monolithically integrated EMLs with vertical integration of active components based on a MGVI structure compatible with single epitaxial growth process, and methods for fabrication of monolithically integrated EMLs, with and without integrated driver and control electronic circuitry One aspect provides a monolithically integrated electro-absorption modulated laser (EML) comprising:
  a semi-insulating (SI) substrate;
  an epitaxial layer structure comprising a plurality of semiconductor layers grown on the SI substrate;
  the epitaxial layer structure defining a plurality of vertically stacked optical waveguides, wherein:
  a first level waveguide comprises layers structured as an output (passive) waveguide;
  a second level waveguide comprises layers structured as an EAM waveguide;
  a third level waveguide comprises layers structured as a DFB laser waveguide;
  layers of the third level waveguide are patterned to define a laser mesa comprising a DFB laser cavity having a surface etched grating (SEG), and a first laterally tapered vertical optical coupler extending from an optical output of the laser cavity;
  layers of the second level waveguide are patterned to define a mesa of the EAM, and a second laterally tapered vertical optical coupler extending from an optical output of the EAM;
  layers of the first level waveguide being patterned to provide an output waveguide;
  the DFB laser cavity being laterally spaced from the EAM along the direction of optical propagation, and the first laterally tapered vertical optical coupler being structured to couple an emitted optical mode from the DFB laser to an input of the EAM; and
  the second laterally tapered vertical optical coupler being structured to vertically couple modulated output from the EAM to the output waveguide;
  and
  electrical interconnections to the DFB laser and to the EAM for operating the DFB laser in CW mode and driving the EAM.

For example, the SI substrate is Fe-doped InP and the EML is fabricated from an InP based material system, comprising selected binary, ternary and quaternary compositions of In, Ga, As, P and Al.

The integrated EML may further comprise a passive waveguide vertically disposed under the first level waveguide and patterned to form a spot size converter (SSC); the first level waveguide comprising a third laterally tapered vertical optical coupler structured to couple the optical output from the output waveguide to the SSC for coupling to a single mode optical fiber.

In some embodiments, the epitaxial layer structure comprises a plurality of semiconductor layers for electronic circuitry underlying the plurality of vertically stacked optical waveguides, the semiconductor layers for electronic circuitry being vertically separated from the plurality of vertically stacked optical waveguides by a spacer layer(s); the optical components comprising the DFB laser, EAM waveguide, output waveguide, and the laterally tapered vertical optical couplers being formed on a first area (island) of the SI substrate;
  the electronic circuitry being formed on a second area (island) of the SI substrate, adjacent the first area, where semiconductor layers of the epitaxial layer stack comprising the spacer layer(s) and all overlying layers have been removed; and
  interconnect metallization providing electrical interconnections between the electronic circuitry and electrical connections of the DFB laser and EAM for operating the DFB laser and driving the EAM.

The electronic circuitry may comprise EAM driver and control circuitry for linearization and temperature compensation, comprising one of:
  an electrical photocurrent sensor for monitoring optical output of the EAM and an electrical temperature sensor for monitoring an operating temperature of the EAM; and
  an optical tap and a photodetector for monitoring optical output of the EAM and an electrical temperature sensor for monitoring the operating temperature of the EAM.

For example, the electronic circuitry comprises EAM driver and control circuitry, and the EAM has first and second electrical terminals for applying a bias voltage for operating the EAM and an electrical control terminal for receiving an input analog modulation signal which is fed through the control circuitry to a drive transistor of driver circuitry of the EAM; and wherein the control circuitry comprises: a first sense means for detecting a temperature of the EAM and generating a first feedback signal dependent on the temperature of the EAM and first control loop element for combining the first feedback signal and the input analog modulation signal to provide a temperature compensated modulation signal; a second sense means for detecting an output level of the EAM and generating a second feedback signal dependent on the output level of the EAM and a second control loop element for combining the second feedback signal and the temperature compensated modulation signal to provide a linearized modulation signal.

In one embodiment, the first sense means for detecting a temperature of the electro-absorption modulate comprises an electrical temperature sensor placed in close proximity to the EAM and the first control loop element for combining comprises a coupler for adding the first feedback signal, to the input analog modulation signal to provide a temperature compensated modulation signal. For example, the first feedback signal comprises a temperature dependent offset bias.

For example, the second sense means comprises electrical components for detecting a photocurrent of the electro-absorption modulator and generating the second feedback signal; or the second sense means comprises electro-optical components comprising an optical tap, for sampling an optical output of electro-absorption modulator, a photodetector and a transimpedance amplifier for generating the second feedback signal.

In an embodiment, the second control loop element for combining the second feedback signal and the temperature compensated modulation signal comprises a differential amplifier, and the temperature compensated modulation signal is input to a non-inverting input of the differential amplifier and the second feedback signal is input to an inverting input of the differential amplifier, to generate an error voltage from the difference between the two signals, which is fed to the driver.

Advantageously, lengths of electrically conductive interconnect tracks between the EAM driver and control circuitry and the EAM are in the range of microns to tens of microns, thereby reducing timing delays and phase delays, e.g. to enable advance modulation schemes.

In example embodiments, the DFB laser is a VC SEG DFB laser.

In EML of some embodiments, the epitaxial layer structure is compatible with a single epitaxial growth process, fabricated using III-V semiconductor materials. In some embodiments, the integrated EML is fabricated using an InP based material system, comprising selected binary, ternary and quaternary compositions of In, Ga, As, P and Al. For example, the SI substrate may be iron doped InP.

Another aspect provides a method of fabricating a monolithically integrated electro-absorption modulated laser (EML), wherein a DFB laser is vertically integrated with an EAM by a laterally tapered vertical optical coupler, comprising:

providing a semi-insulating (SI) substrate;
growing on the SI substrate an epitaxial layer structure, the epitaxial layer structure comprising a plurality of vertically stacked optical waveguides, wherein:
a first level waveguide comprises layers structured as an output (passive) waveguide;
a second level waveguide comprises layers structured as an EAM waveguide;
a third level waveguide comprises layers structured as a DFB laser waveguide; patterning layers of the third level waveguide to define a laser mesa comprising a DFB laser cavity having a surface etched grating (SEG), and a first laterally tapered vertical optical coupler extending from an optical output of the laser cavity;
patterning layers of the second level waveguide to define a mesa of the EAM, and a second laterally tapered vertical optical coupler extending from an optical output of the EAM;
patterning layers of the first level waveguide to define an output waveguide;
the DFB laser cavity being laterally spaced from the EAM along the direction of optical propagation, and the first laterally tapered vertical optical coupler being structured to couple an emitted optical mode from the DFB laser to an input of the EAM; and
the second laterally tapered vertical optical coupler being structured to vertically couple modulated output from the EAM to the output waveguide;
and
providing electrical connections to the DFB laser and to the EAM for operating the DFB laser in CW mode and driving the EAM.

In yet another aspect, there is provided a method of fabricating a monolithically integrated electro-absorption modulated laser (EML), wherein a DFB laser is vertically integrated with an EAM and integrated electronic circuitry, comprising:

providing a semi-insulating (SI) substrate;
growing a blanket epitaxial layer structure on first and second areas of the semi-insulating substrate,
the first area being designated for optical components of the EML and the second area being designated for electronic circuitry;
the blanket epitaxial layer structure comprising:
a first plurality of semiconductor layers for fabrication of electronic circuitry;
at least one spacer layer comprising a selective etch stop; and
a plurality of vertically stacked optical waveguides, wherein:
a first level waveguide comprises layers structured as an output (passive) waveguide;
a second level waveguide comprises layers structured as an EAM waveguide;
a third level waveguide comprises layers structured as a DFB laser waveguide;
protecting the first area and selectively removing from the second area the plurality of vertically stacked optical waveguides and the at least one spacer layer;
processing the first plurality of semiconductor layers to define the electronic circuitry;
protecting the second area comprising the electronic circuitry;
processing the plurality of vertically stacked optical waveguides comprising:
patterning layers of the third level waveguide to define a laser mesa comprising a DFB laser cavity having a surface etched grating (SEG), and a first laterally tapered vertical optical coupler extending from an optical output of the laser cavity;

patterning layers of the second level waveguide to define a mesa of the EAM, and a second laterally tapered vertical optical coupler extending from an optical output of the EAM;

patterning layers of the first level waveguide to define an output waveguide;

the DFB laser cavity being laterally spaced from the EAM along the direction of optical propagation, and the first laterally tapered vertical optical coupler being structured to couple an emitted optical mode from the DFB laser to an input of the EAM; and the second laterally tapered vertical optical coupler being structured to vertically couple modulated output from the EAM to the output waveguide;

and providing electrical connections between the electronic circuitry and the DFB laser and the EAM, for operating the DFB laser in CW mode and driving the EAM.

When the EML further comprises a vertically integrated spot size converter (SSC) for coupling optical output of the EML to a single mode fiber, the method further comprises:
after growing the first plurality of semiconductor layers for fabrication of electronic circuitry and the at least one spacer layer comprising a selective etch stop, and before growing overlying layers of the blanket epitaxial layer structure, etching a deep trench through said first plurality of semiconductor layers and the at least one spacer layer comprising a selective etch stop, and into the underlying substrate;

growing within the deep trench epitaxial layers for the SSC;

and wherein patterning of the first level waveguide to define an output waveguide further comprises defining a third laterally coupled vertical coupler to couple the optical output from the output waveguide to the SSC.

Another aspect provides an integrated EML comprising: a semi-insulating substrate, a laser diode and an electro-absorption modulator integrated on the semi-insulating substrate.

The foregoing and other objects, features, aspects and advantages of the present invention will become more apparent from the following detailed description, taken in conjunction with the accompanying drawings, of embodiments of the invention, which description is by way of example only.

BRIEF DESCRIPTION OF THE DRAWINGS

FIG. 19 shows a schematic plot of bandwidth vs. frequency for a vertically integrated EML of an example embodiment fabricated on a SI substrate; and FIG. 20 shows a table to compare features of a conventional EML using multiple-growth and butt-coupling of a laser diode and EAM and a vertically coupled EML of an example embodiment.

DETAILED DESCRIPTION

Figure 1:
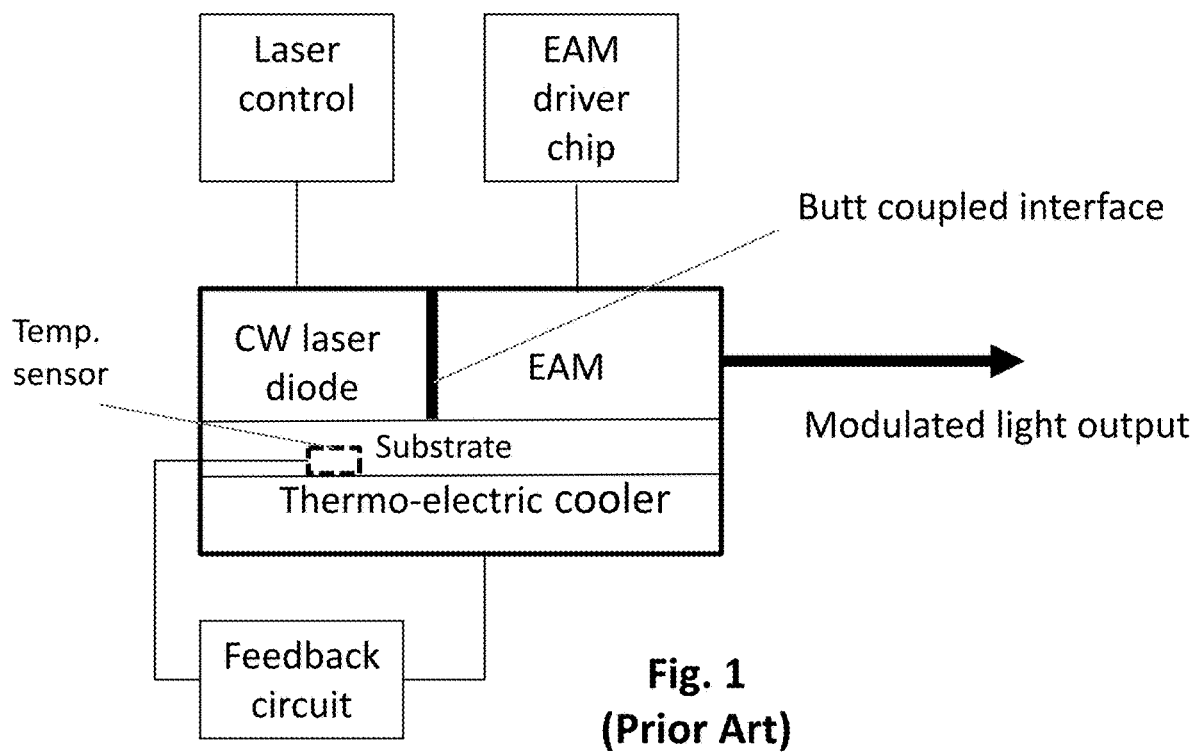
FIG. 1 (Prior Art) shows a schematic block diagram of an example of a butt-coupled EML assembly.
Figure 2:
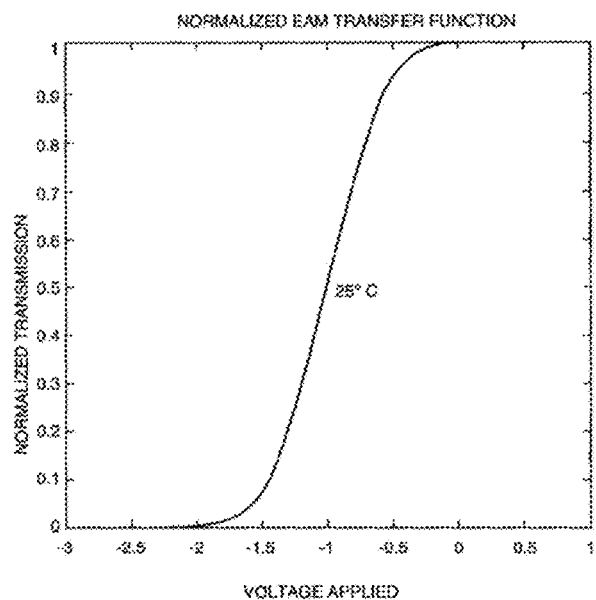
FIG. 2 (Prior Art) shows a typical transfer function for the EML of FIG. 1.

A schematic block diagram of an example of a butt-coupled EML assembly is shown in FIG. 1 (Prior Art). The EML assembly comprises a CW laser diode bonded to a EAM, mounted on a common substrate, which is back-side cooled using a thermo-electric cooler (TEC). FIG. 2 (Prior Art) shows a typical normalized transfer function for an EML such as shown in FIG. 1, i.e. a normalized transmission of the EAM as a function of applied voltage. In this example the EAM has 100% transmission at the designated wavelength with zero bias, and 0% transmission at a reverse bias of −2V.

Figure 3:
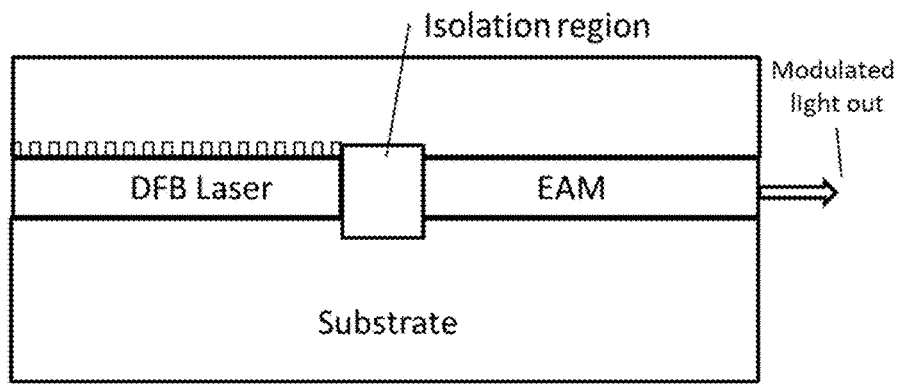
FIG. 3 (Prior Art) shows a schematic longitudinal cross-sectional view of an integrated EML comprising a DFB laser and EAM which are fabricated on the same substrate using different epitaxial layer structures for the DFB laser and EAM.
Figure 4:
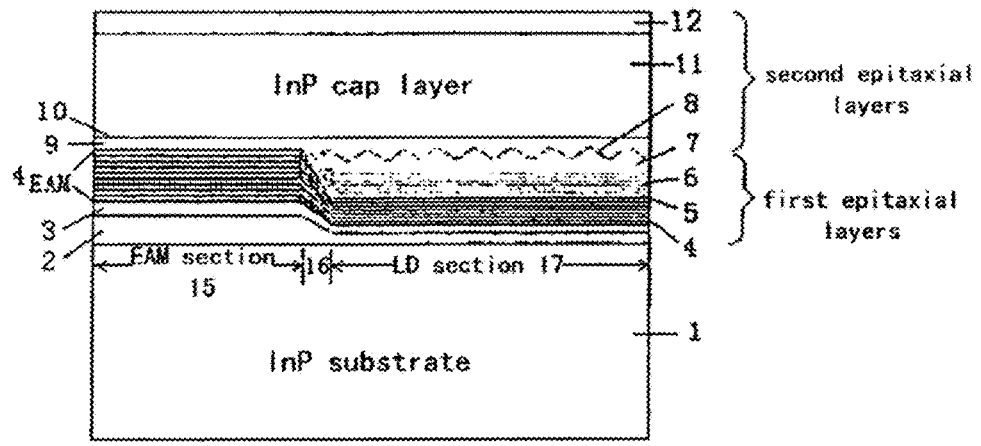
FIG. 4 (Prior Art) shows a schematic longitudinal cross-sectional view of an integrated EML of a stacked layer structure fabricated by selective area growth.
Figure 5:
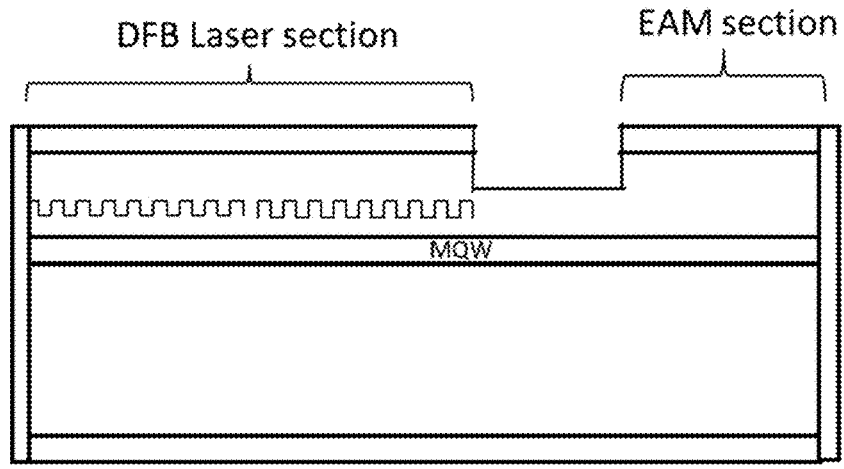
FIG. 5 (Prior Art) shows a schematic longitudinal cross-sectional view of an integrated EML comprising a DFB laser and EAM which are fabricated on the same substrate with a shared epitaxial layer structure for the DFB laser and the EAM.

FIGS. 3 to 5 (Prior art) show schematic longitudinal cross-sectional views (i.e. through the axis of optical propagation) of three examples of monolithically integrated EML. The EML shown schematically in FIG. 3 comprises a DFB laser and EAM which are fabricated on the same substrate using two different epitaxial layer structures for waveguide structures for the DFB laser and EAM, which are optically coupled through an isolation region (e.g. see WO2018/091094A1). The EML show schematically in FIG. 4 has a stacked layer structure fabricated by selective area growth of a plurality of epitaxial layers 1 to 12 on a stepped substrate (e.g. see U.S. Pat. No. 7,476,558) wherein epitaxial layers 5 to 8, which form the waveguide of laser diode (LD) section 17, are selectively removed from the portion forming the EAM section 15, which comprises epitaxial layers 4 on the step formed by thicker parts of layers 2 and 3, so that the optical axis of the EAM and LD are horizontally co-planar, and the EAM and LD are laterally butt-coupled by the upper part of the isolation region 16. The EML shown schematically in FIG. 5 (Prior Art) comprises a DFB laser and EAM which are fabricated on the same substrate with a shared epitaxial layer structure (e.g. see US2010/0290489A1).

Each of the EML structures shown in FIGS. 1 to 5 are examples of directly or indirectly butt-coupled lasers and EAM. Butt-coupled EML tend to exhibit early failure and reliability issues, e.g. due to stress/strain in the interface region between the laser and EAM, particularly for higher power operation.

Monolithically integrated EML of some example embodiments of the present invention will now be described, by way of example. Each integrated EML comprises a DFB laser and EAM which are vertically integrated, fabricated using MGVI, wherein the DFB laser and the EAM are vertically coupled by a laterally tapered vertical coupler.

Figure 6:
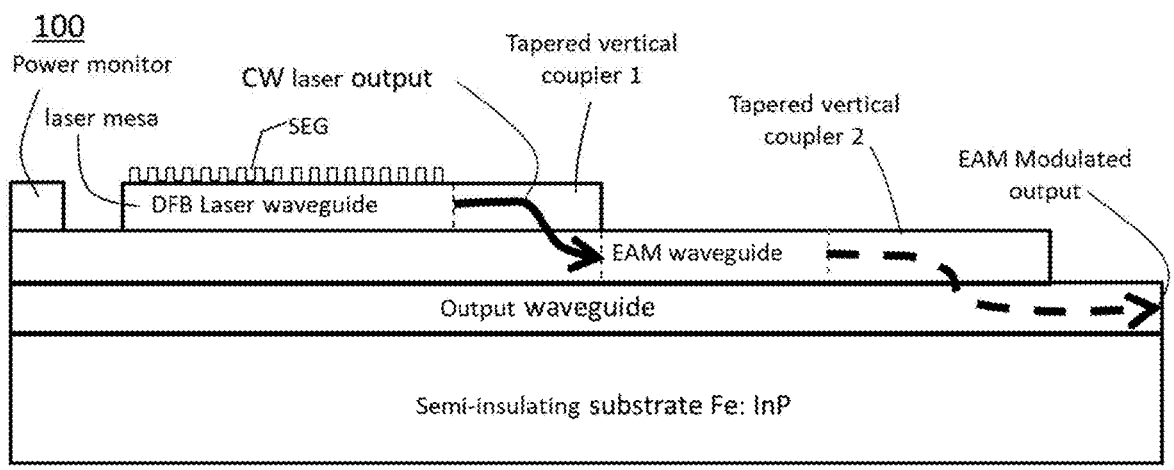
FIG. 6 shows a schematic longitudinal cross-sectional view of a monolithically integrated EML of a first embodiment, fabricated using MGVI.
Figure 7:
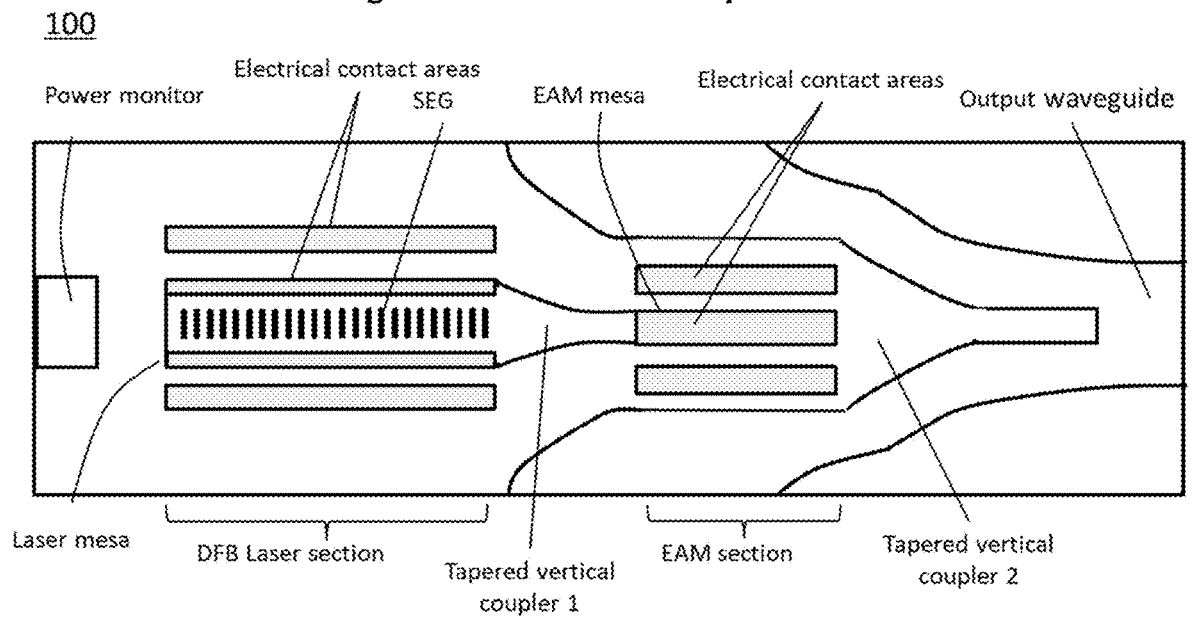
FIG. 7 shows a schematic plan view of the monolithically integrated EML of the first embodiment.

FIG. 6 shows a schematic longitudinal cross-sectional view of a monolithically integrated EML 100 of a first embodiment, comprising a DFB laser and EAM, fabricated using MGVI. This method of fabrication provides for vertical integration of active and passive components formed in multiple vertically stacked waveguides, and is compatible with single epitaxial growth, e.g. using an InP based material system. In this example, the structure comprises a semi-insulating (SI) substrate, e.g. Fe doped InP, on which an epitaxial layer stack (which may be referred to as an epi-layer stack or epi-stack or epilayers) is grown to define layers of: a first level waveguide, labelled output waveguide; a second level waveguide, labelled EAM waveguide; and a third level waveguide labelled DFB laser waveguide, on which is defined a surface-etched-grating SEG. The waveguides are optically coupled vertically by vertical couplers formed by laterally tapered portions of the respective waveguides, as illustrated schematically in the schematic plan view of the monolithically integrated EML 100 of the first embodiment, which is shown in FIG. 7. The third level waveguide is processed to define a laser mesa and a first laterally tapered vertical coupler 1. The SEG is etched in a top surface of the DFB laser portion of the mesa to form the DFB laser and the tapered vertical coupler extends from the optical output of the laser over a length of the second level waveguide for vertically optical coupling of the emitted mode from the laser to the second level waveguide. Electrical contact areas for driving the DFB laser are provided, e.g. on top of the mesa along edges of the mesa, and each side of the mesa, as illustrated schematically in FIG. 7.

Figure 8:
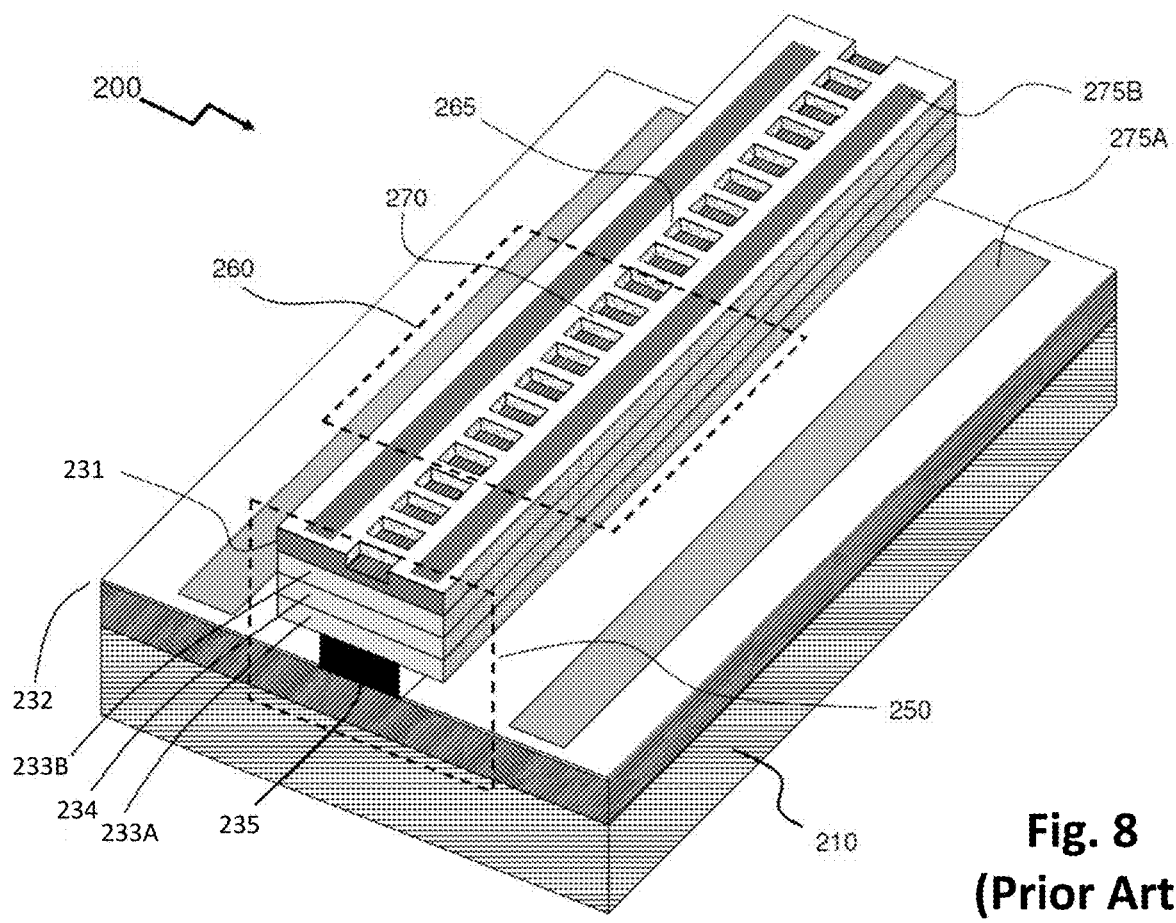
FIG. 8 (Prior Art) shows an isometric view of an example of a DFB laser in the form of a vertically-coupled SEG DFB laser which is compatible with fabrication of a monolithically integrated EML using MGVI.

As an example, FIG. 8 (Prior Art) shows an isometric view of an embodiment of a vertically-coupled (VC) SEG DFB laser 200, which is compatible with fabrication of monolithically integrated EML using MGVI. The structure and fabrication of the VC SEG DFB laser shown in FIG. 8 are described in US2012/0106583A1 and related applications. That is, the epitaxial layer structure of waveguide forming the DFB laser comprises, e.g.: a substrate layer 210, upper and lower emitter layers 231 and 232, upper and lower separate confinement heterostructures 233A and 233B, and a multi-quantum well active gain region 234, with at least one layer of the laser mesa, e.g. an aperture layer 235, being structured to provide lateral optical confinement of the fundamental optical mode and lateral confinement of current injection. The SEG 270 comprises trenches 265 etched into a top surface of the laser mesa. Electrical contacts 275A and 275B are provided to the lower and upper emitter layers. The output facet of the DFB laser, i.e. in plane 250, is an etched facet.

Referring back to FIG. 6, the epitaxial layers of the second level waveguide are structured to form the EAM waveguide, i.e. comprising upper and lower cladding layers and a multi-quantum well semiconductor structure having a composition with an electrically controllable absorption to provide an appropriate transfer function, e.g. high transmission (substantially transparent) of light of the laser wavelength at zero bias, and minimal transmission under a reverse bias of a few volts. Electrical contact areas for the EAM are provided along the length of the EAM section of the waveguide, i.e. on top of the EAM mesa and each side of the EAM mesa, e.g. as illustrated schematically in FIG. 7. The second level waveguide extends along the optical propagation direction from the EAM, and is patterned to form a laterally tapered second vertical optical coupler 2 for optically coupling modulated light transmitted by the EAM to the underlying first level waveguide, which acts as an optical output waveguide. The lateral tapering of the vertical optical couplers 1 and 2 of the second and third level waveguides are shown schematically in FIG. 7. The optical path of the cw output from the laser, which is vertically coupled through first vertical coupler, through the EAM to produce modulated output which is vertically coupled through the second vertical coupler to the first level (output) waveguide is represented schematically by the large arrows in the schematic longitudinal cross-sectional view shown in FIG. 6. If required, the third level waveguide may also be structured to provide a detector for back-facet power monitoring (not shown).

The epitaxial layer structure may be selected to be compatible with a single epitaxial growth process. Multiple epitaxial growth steps may alternatively be used.

The general principles of selecting materials and structuring the waveguide layers for vertical optical coupling using laterally tapered vertical optical couplers, i.e. appropriate selection of bandgap wavelength and refractive index, is described in, e.g. U.S. Pat. No. 7,444,055B2 to Tolstikhin, entitled "Integrated Optics Arrangements for Wavelength (de)Multiplexing in a Multi-Guide Vertical Stack", and references cited therein.

Figure 9:
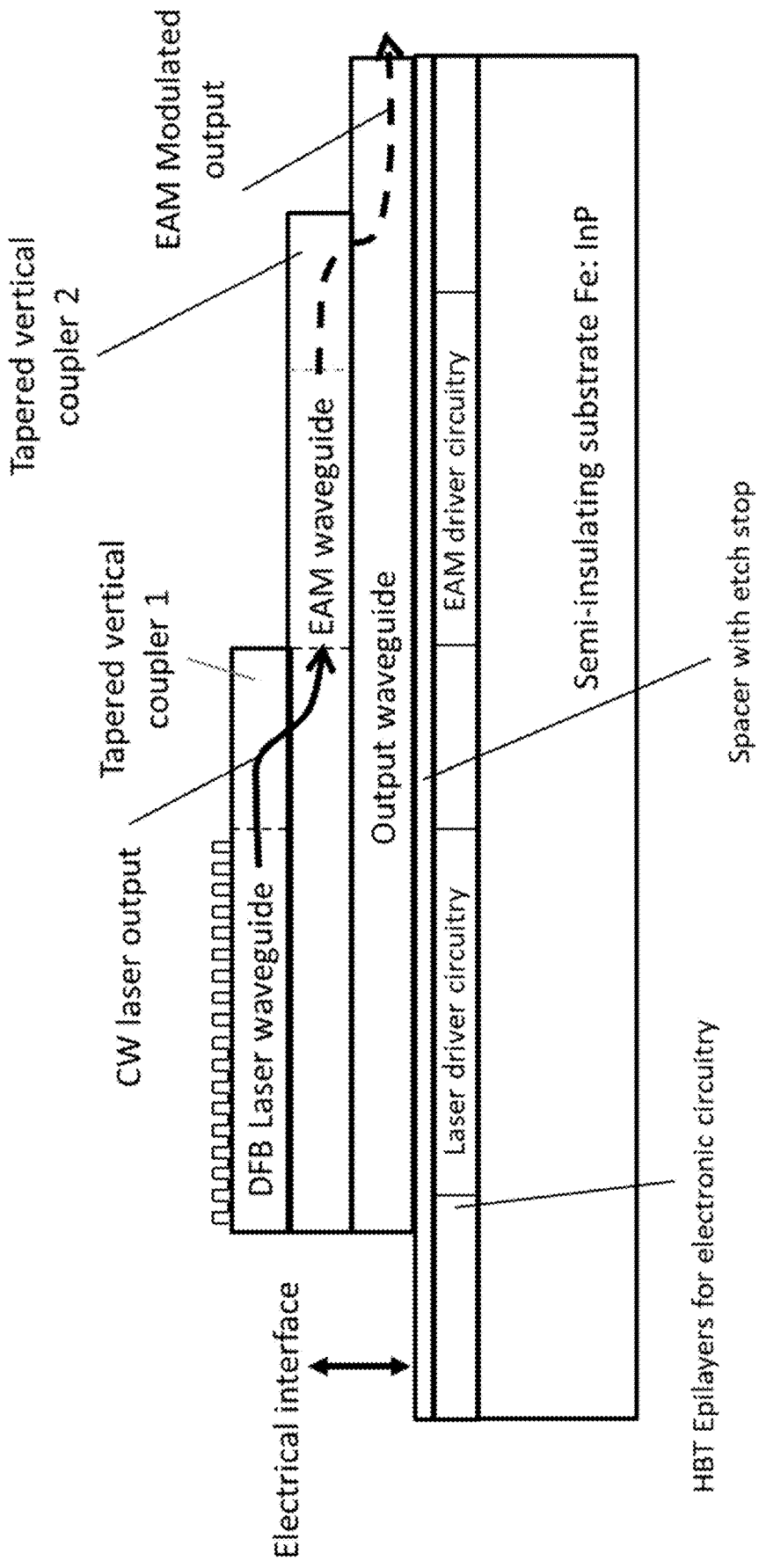
FIG. 9 shows a schematic longitudinal cross-sectional view of an integrated EML of a second embodiment, fabricated using MGVI, and comprising integrated electronic circuitry.

A schematic longitudinal cross-sectional view of an integrated EML 300 of a second embodiment, fabricated using MGVI, is shown in FIG. 9. In this embodiment, the EML is monolithically integrated with EAM driver circuitry and laser driver circuitry. The latter comprises bias control for operation of the laser as a CW light source, and optionally comprises other elements, e.g. for temperature sensing, power monitoring, control loop for temperature stabilization and power adjustment. The layers forming the three vertically stacked waveguides for the DFB laser and the EAM modulator, and the output waveguide, and the laterally tapered vertical couplers, are similar to those shown in FIG. 6. The structure shown schematically in FIG. 9 differs from that shown in FIG. 6 in that additional layers are provided between the SI substrate and the waveguide layers. That is, the additional layers comprise layers for forming high-speed electronic circuitry for the laser driver and EAM driver circuitry. The additional layers comprise InP based semiconductor layers for fabricating heterojunction bipolar transistors (HBT), which are labelled as HBT epilayers for electronic circuitry, and a spacer, which comprises one or more layers and includes one or more etch stop layers, which allow for separate processing of the optical components and the electronic circuitry.

Figure 10:
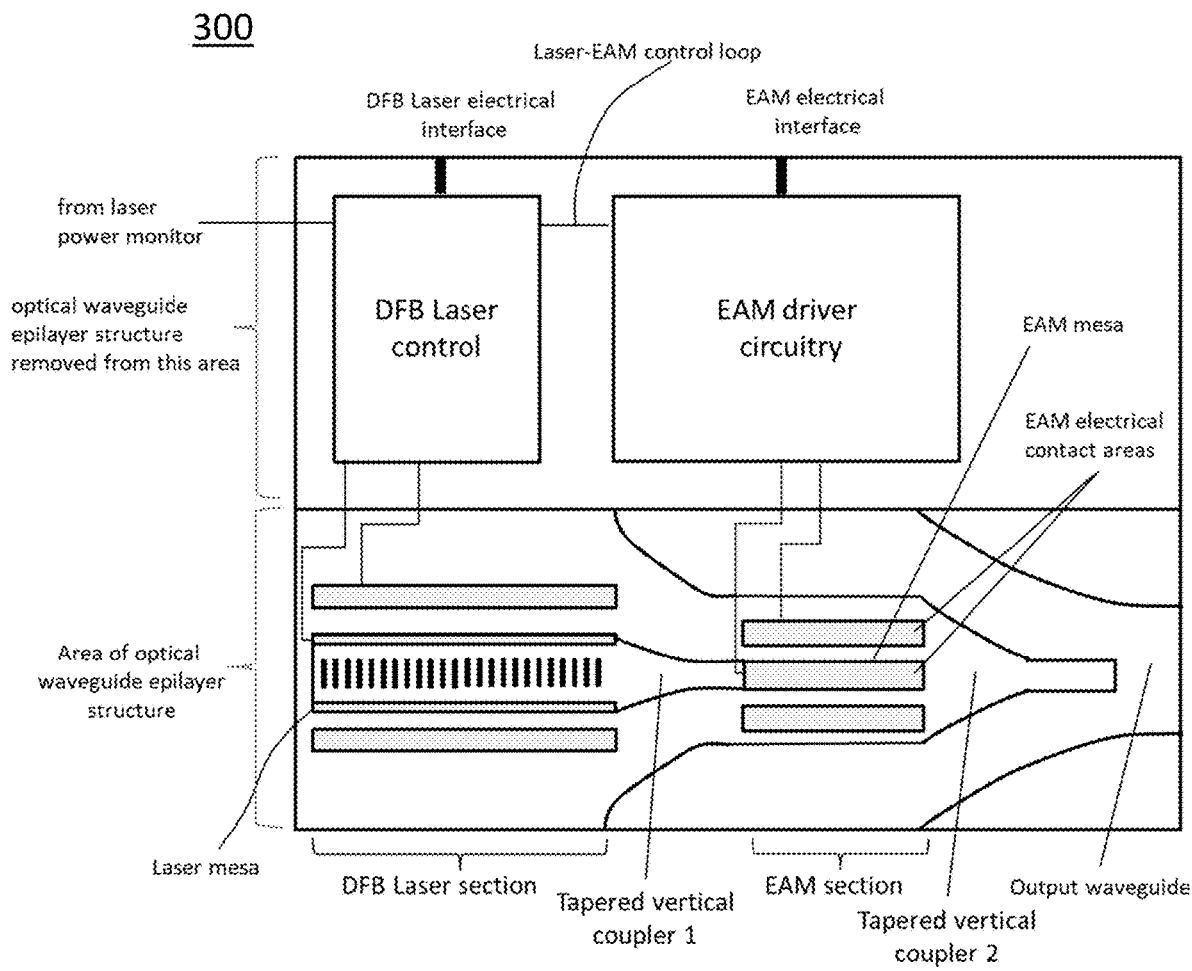
FIG. 10 shows a schematic plan view of the integrated EML of the second embodiment.

As shown in FIG. 10, which is a schematic plan view of EML 300 of this embodiment, the multilevel optical waveguide structure for the DFB laser, EAM and output waveguide of the second embodiment are formed on a first area (island 1) of the SI substrate, and the electronic circuitry is formed on an adjacent second area (island 2) of the SI substrate, e.g. laterally spaced from the optical components.

Figure 11A:
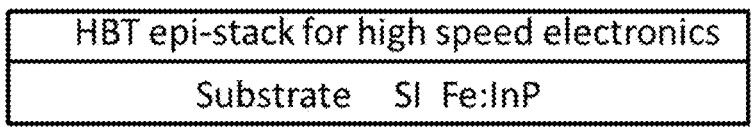
FIGS. 11A and 11B show schematic cross-sectional views representing some steps in a method of fabrication of the device structure of FIGS. 9 and 10.
Figure 11A:
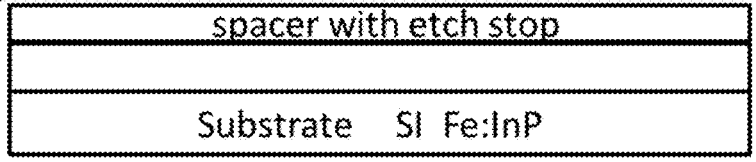
Figure 11A:
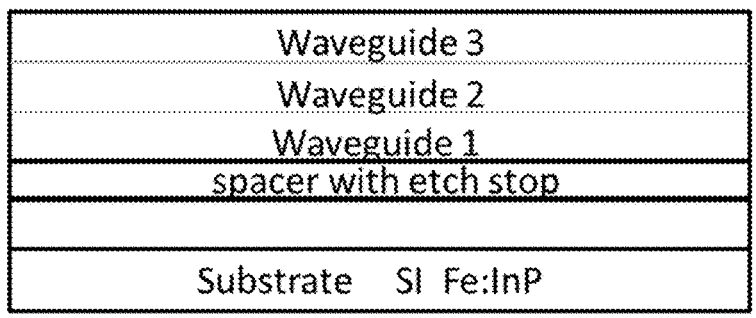
Figure 11A:
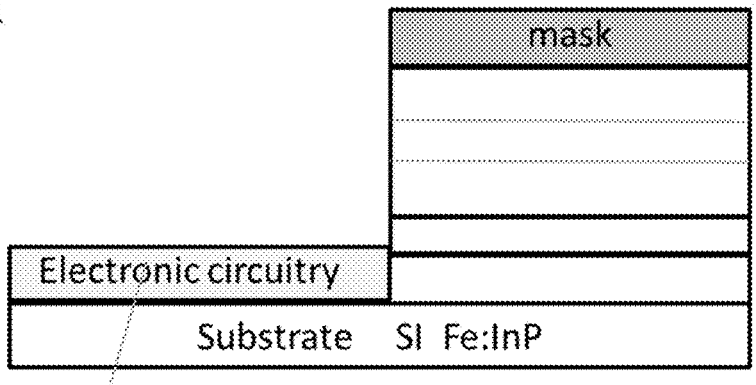
Figure 11B:
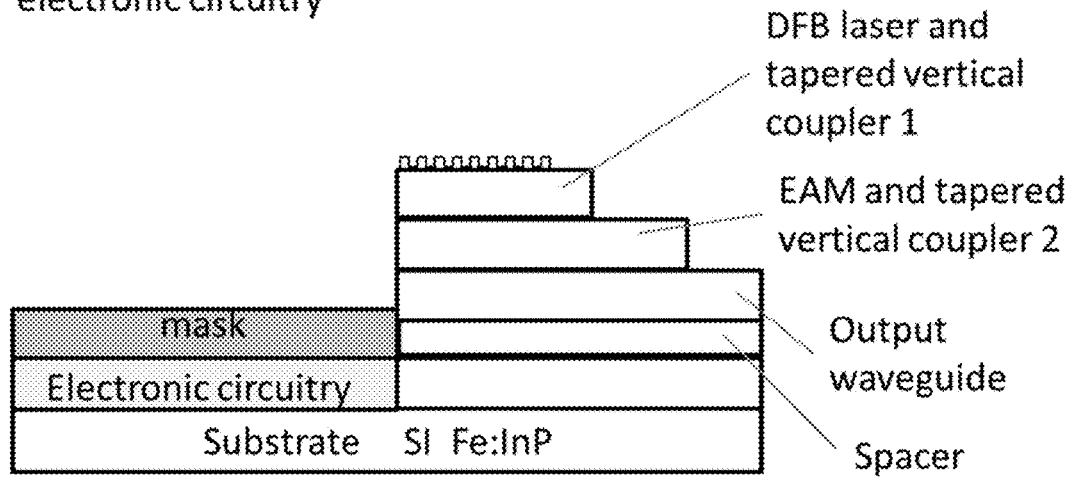
Figure 11B:
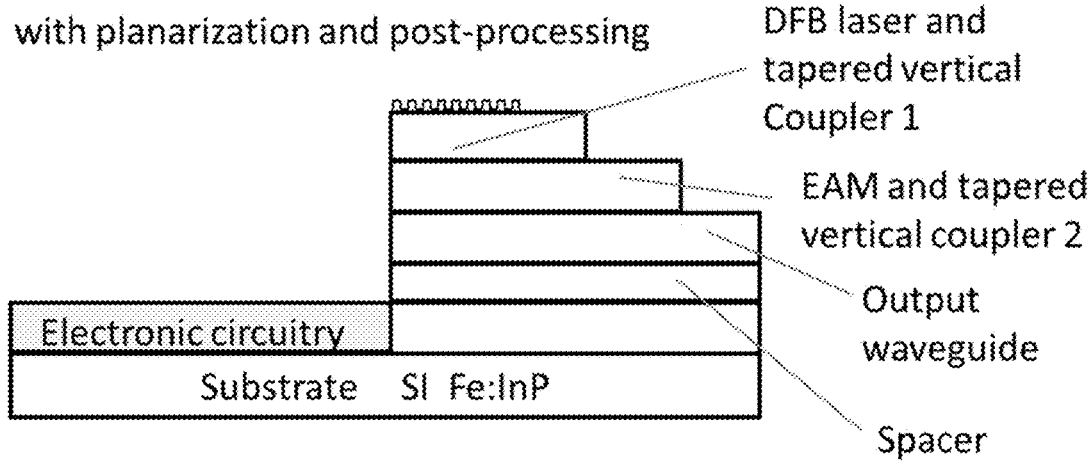

FIGS. 11A and 11B illustrate schematically examples of some of the processing steps 300-1 to 300-6 for fabrication of an EML device structure with integrated driver circuitry, such as shown in FIGS. 9 and 10. A first epitaxial layer stack, comprises semiconductor layers for fabrication of InP heterojunction bipolar transistors, and is referred to as the "HBT epi-stack". The HBT epi-stack for the high-speed electronics is grown on the SI substrate (step 300-1). If the high-speed electronics were grown on top of the optical components, the conductivity of the layers forming the laser and EAM waveguides would reduce the speed of operation of the transistors. Thus, a second epi-layer stack ("optical epi-stack") for the optical waveguides is grown above the layers for the electronics, and includes a spacer, or stitching layers (step 300-2) which include an etch stop, which separates the HBT epi-stack and the overlying epi-stack for the optical wave guides (step 300-3). Note that, if required, the epitaxial layers may be selected to be compatible with a single epitaxial growth process for forming all of the HBT epi-layer stack, the stitching layers, and the optical epi-layer stack. Multiple epitaxial growth steps may alternatively be used.

For example, for fabrication of the integrated EML structure shown schematically in FIGS. 9 and 10, the optical epi-layer stack is structured to form first, second and third level waveguides (step 300-3 in FIG. 11A). Both the HBT and optical epi-layer stacks, and the stitching layers, are blanket deposited over the entire substrate. Then device areas (islands) for the optical components are protected, e.g. by a mask layer and the exposed part of the optical epi-stack is etched back to the HBT epi-stack (step 300-4). The size of the islands for the optical components and for the electronic components are selected so that during subsequent processing, there is enough planar area for each island to allow for proper alignment and stepper lithography, including placement of alignment marks on exposed surface layers. The materials of the stitching layers in-between the HBT epi-stack and the optical epi-stack are selected so that that there is at least one highly etch-selective etch stop layer in between the optical epi-stack and the HBT epi-stack, for subsequent processing steps, e.g. for independent processing of the electrical circuitry components vs. optical components.

The HBTs and other components for the electronic circuitry are processed while the optical epi-stack is protected, up to the point that interconnect metallization is required. A first level of interconnect metallization may be provided for the electronic circuitry. Second level interconnect metallization for the electronic circuitry and for electrical connections to the optoelectronic components is provided later in the process sequence, after processing of the optical components.

Referring to FIG. 11B, the device structures of the HBT epi-stack are then protected, e.g. by a mask (see step 300-5) and the mask (i.e. see step 300-4) is removed from the optical epi-stack. The optical components comprising the DFB laser, EAM and lateral tapers for the vertical optical couplers are then processed from the top down to define the structures of each waveguide. These process steps may comprise, for example, a) patterning and etching of the laser waveguide to define sidewalls of the laser mesa and the laterally tapered first vertical optical coupler 1, and etching of the SEG for the laser; b) patterning and etching of the EAM waveguide to define the sidewalls of the EAM and the laterally tapered second vertical optical coupler 2; c) patterning and etching of the output waveguide.

After these optical waveguide structures are complete, and after removal of the mask from the electronic device structures of the HBT epi-stack, back-end metallization and interconnection of the electrical circuitry and electrical connections for optical devices is performed, including a planarization and post-processing.

As mentioned above, if required, in some embodiments, the epitaxial layers may be selected to be compatible with a single epitaxial growth process for forming the HBT epi-layer stack, the stitching layers, and the optical epi-layer stack. Alternatively, in other embodiments, multiple epitaxial growth steps may be used.

It will be appreciated that the schematics shown in the Figures, e.g. FIGS. 6 to 10, 11A and 11B referred to above, are highly simplified representations of the layers of the device structures, and layer thicknesses and lateral dimensions, are not drawn to scale. While elements of only one EML device structure are shown in each drawing, in practice fabrication is done on a wafer scale, with many EML devices per wafer. As will be appreciated, each of the waveguides comprise many epitaxial layers e.g. a core comprising a MQW active region, SCH layers and cladding layers of the waveguide; the substrate and the HBT epi-stack and the optical epi-stack may include additional layers, e.g. buffer layers, intermediate layers, spacers, as appropriate. Semiconductor materials comprise III-V semiconductor materials which are suitable for fabrication of both the HBT epi-layer stack for the high speed electronic circuitry and the optical epi-layer stack for the waveguides for the active and passive optical components. For example, semiconductor materials may comprise III-V semiconductors based on an InP material system, e.g., comprising selected binary, ternary and quaternary compositions of In, Ga, As, P and Al. For example, the SI substrate comprises Fe-doped InP.

Figure 12A:
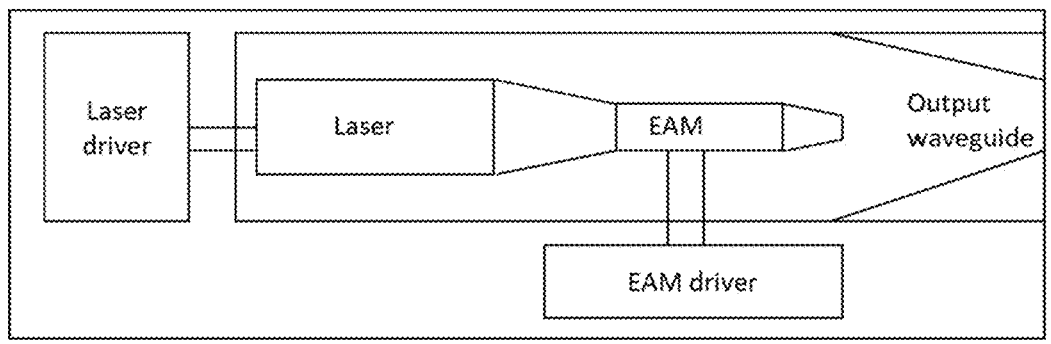
FIG. 12A shows a schematic plan view of an integrated EML of a third embodiment comprising integrated driver and control circuitry.
Figure 12B:
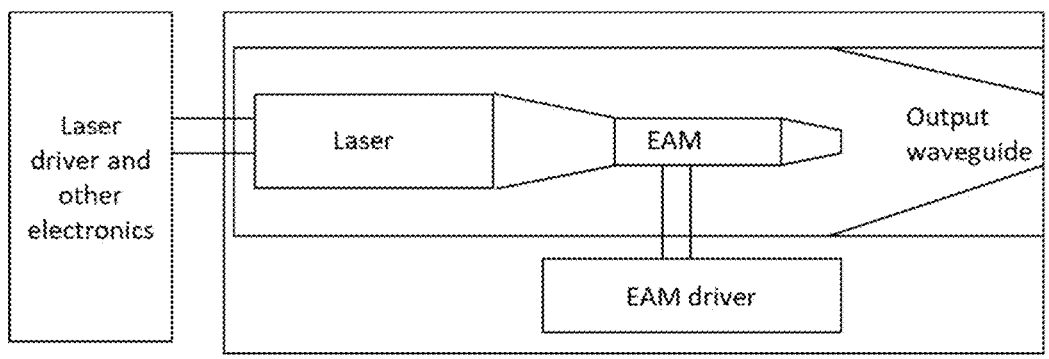
FIG. 12B shows a schematic plan view of an integrated EML of a fourth embodiment comprising integrated driver and control circuitry.

Referring to the schematic plan view shown in FIG. 10, in the EML 300 of the second embodiment, the DFB laser control circuitry and EAM driver and control circuitry are shown schematically as positioned laterally of the EML. In the cross-sectional view shown in step 300-6 in FIG. 11B, driver electronics are shown schematically as positioned on an area spaced longitudinally from the EML waveguide structures, e.g. behind the back facet of the DFB laser. As mentioned above, a back facet power monitor for the laser, i.e. a pin diode detector (not illustrated in the Figures) may be included. In practice, the integrated electronic circuitry may be positioned on the SI substrate around the EML as appropriate, e.g. to optimize interconnect, distribute heat generation from the electronics, and to optimize use of the device area. Beneficially, the integrated EAM driver circuitry is positioned in close proximity to the EAM to minimize interconnect lengths, e.g. to enable higher performance modulation. For example, a schematic plan view of a device area of an integrated EML 400-1 of a third embodiment, comprising monolithically integrated driver and control circuitry, is shown in FIG. 12A. In the layout of this embodiment, the EAM driver and control electronics are positioned near the EAM, to optimize interconnect, e.g. provide shorter interconnect lengths, for high performance modulation, and the laser driver electronics are positioned behind the back-facet of the DFB laser. It will be appreciated that, for example, in an integrated EML 400-2 of an alternative embodiment, illustrated schematically in FIG. 12B, the EML is monolithically integrated with the EAM driver and control electronics, while other electronics, e.g. the laser driver, monitoring and control circuitry, are provided on a separate chip. In other embodiments based on the monolithically integrated EML structure shown in FIGS. 6 and 7 without integrated electronics, the laser and EAM driver and control electronics are provided as separate chips.

Figure 13:
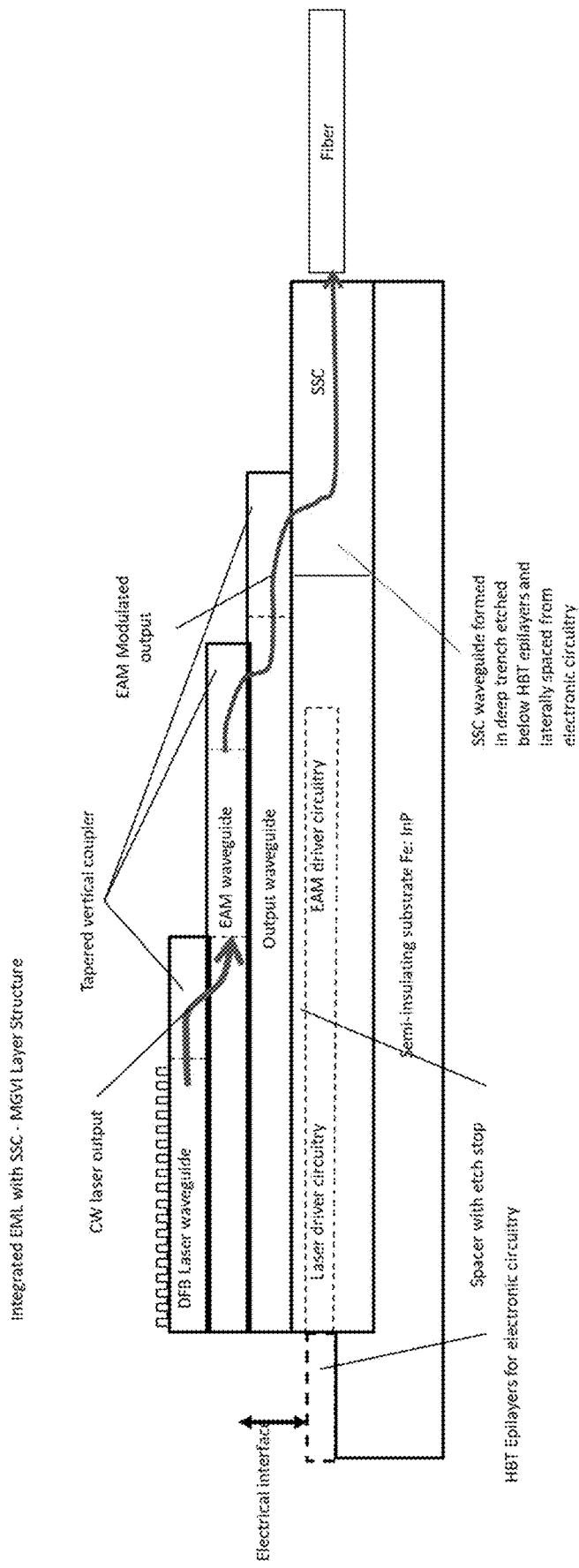
FIG. 13 shows a schematic longitudinal cross-sectional view of an integrated EML of a fifth embodiment, fabricated using MGVI, comprising a spot-size-converter (SSC) and integrated driver electronics.

A schematic longitudinal cross-sectional view of an integrated EML 500 of a fifth embodiment, fabricated using MGVI, is shown in FIG. 13. The EML 500 differs from EML 300 shown schematically in FIGS. 9 and 10 in that it also includes a spot-size-converter (SSC) for direct coupling of the optical output to a single-mode optical fiber. That is, the first level waveguide is a coupling waveguide, which is vertically optically coupled by a laterally tapered third vertical optical coupler to waveguide layers of the SSC. The SSC forms a diluted coupling waveguide at the bottom of the vertical stack for low-loss, high alignment tolerance coupling to single-mode fiber. The SSC is formed in a deep trench etched into the layers of the spacer, HBT epi-stack, and into the substrate.

Figure 14:
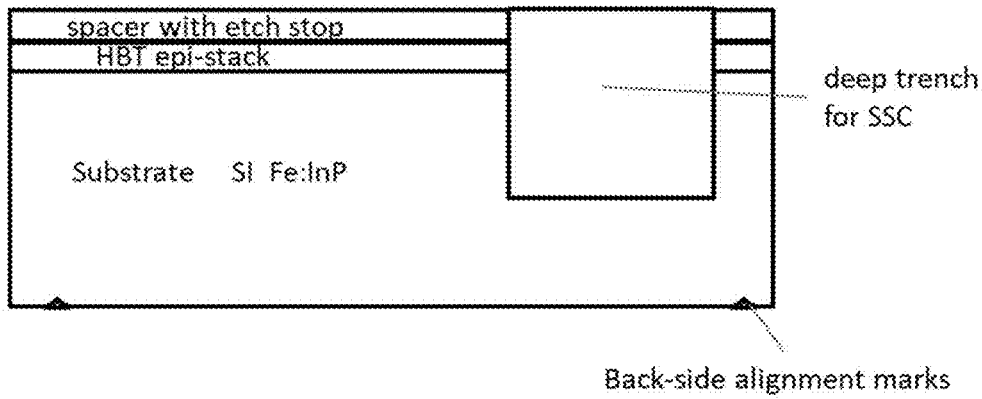
FIG. 14 shows schematic cross-sectional views representing some steps in fabrication of the device structure of FIG. 13.
Figure 14:
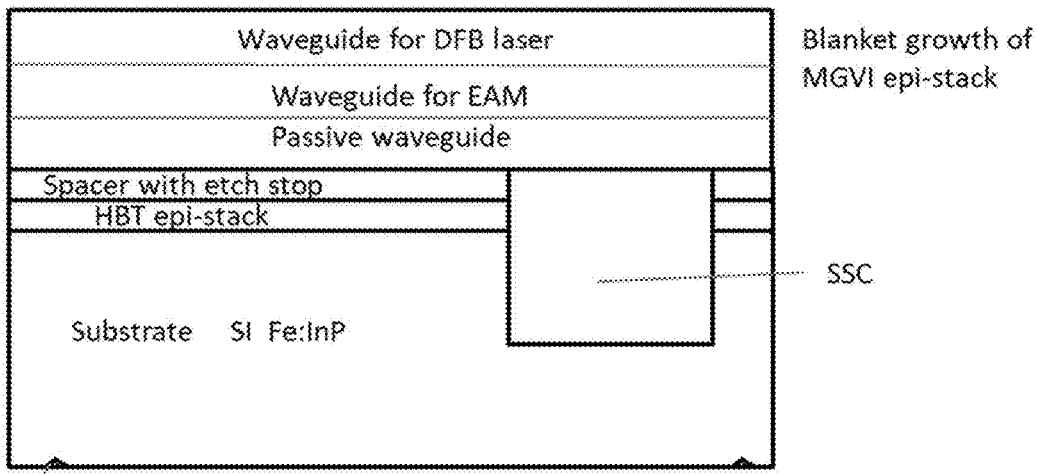
Figure 14:
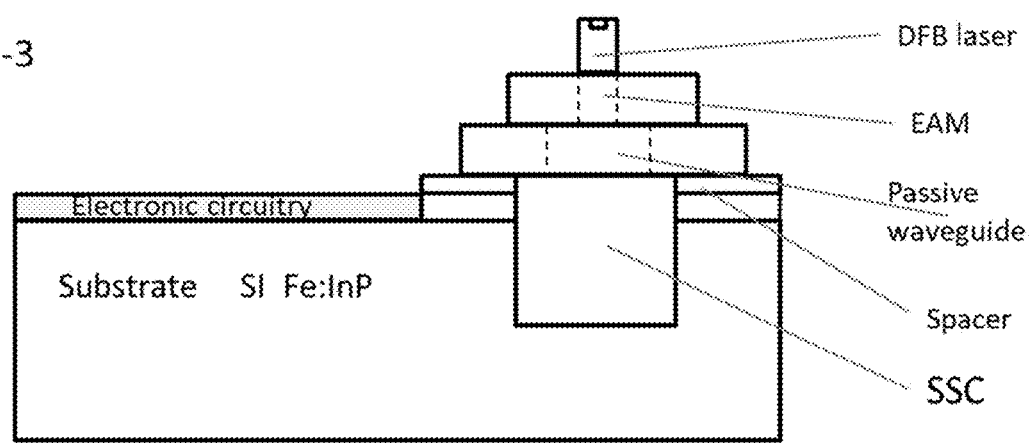

In fabrication of an EML 500 of the embodiment illustrated in FIG. 13, the process flow is adjusted, as illustrated schematically in FIG. 14, because of the required topography for the SSC. For example, the SSC has a height and width, e.g. ~7 µm, for alignment and optical coupling to a standard single mode optical fiber, whereas the thickness of the HBT epi-stack and the spacer may be, e.g. ~2 µm. For the integration of the SSC to be successfully achieved, as illustrated in the process steps 500-1 to 500-3 shown schematically in FIG. 14, the HBT epi-stack is grown on the SI substrate, together with layers for the spacer. Backside alignment marks are etched into the substrate wafer, to allow for alignment of subsequent processing. Next, deep trenches are etched into the substrate wafer, through the HBT epi-stack, and into the substrate (500-1). These deep trenches define the location of the SSC for each island. The SSC epi-layer stack is then grown in the trenches, e.g. using a lift-off process. The top layer of the SSC epi-layer stack is selected to have a material that is etch selective to the surrounding layers of the HBT epi-stack. The SSC epi-stack is grown slightly proud of the trench, and then planarized using a selective dry-etch chemistry to planarize the SSC material to the surface of the HBT epi-stack. A quick wet etch may be required at this point to remove any roughness from the surface. Next the optical epi-stack for the waveguides for the coupling waveguide, EAM and DFB laser is grown blanket across the wafer (500-2). Using the backside alignment marks to align the SSC waveguides in their trenches, the optical epi-stack is protected, and the process continues with fabrication the electronic circuitry and the optical components (500-3), e.g. as described above with reference to FIGS. 11A and 11B. As shown schematically in 500-3 of FIG. 14, the electronic circuitry for the EML of this embodiment occupies an area beside the EML waveguide stack.

Figure 15:
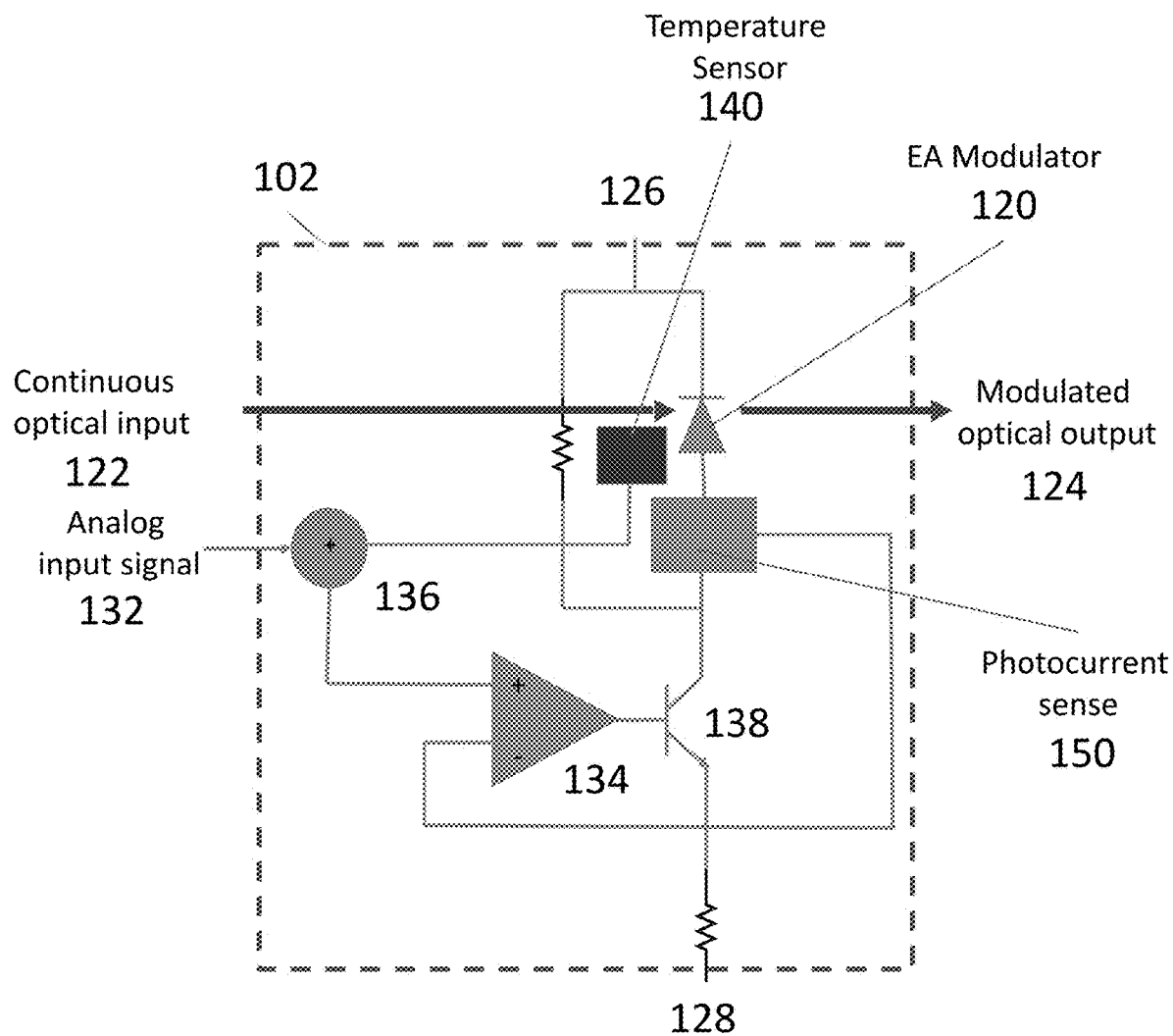
FIG. 15 shows a circuit schematic for a first example of an electro-absorption modulator having monolithically integrated control circuitry for linearization and temperature compensation.
Figure 16:
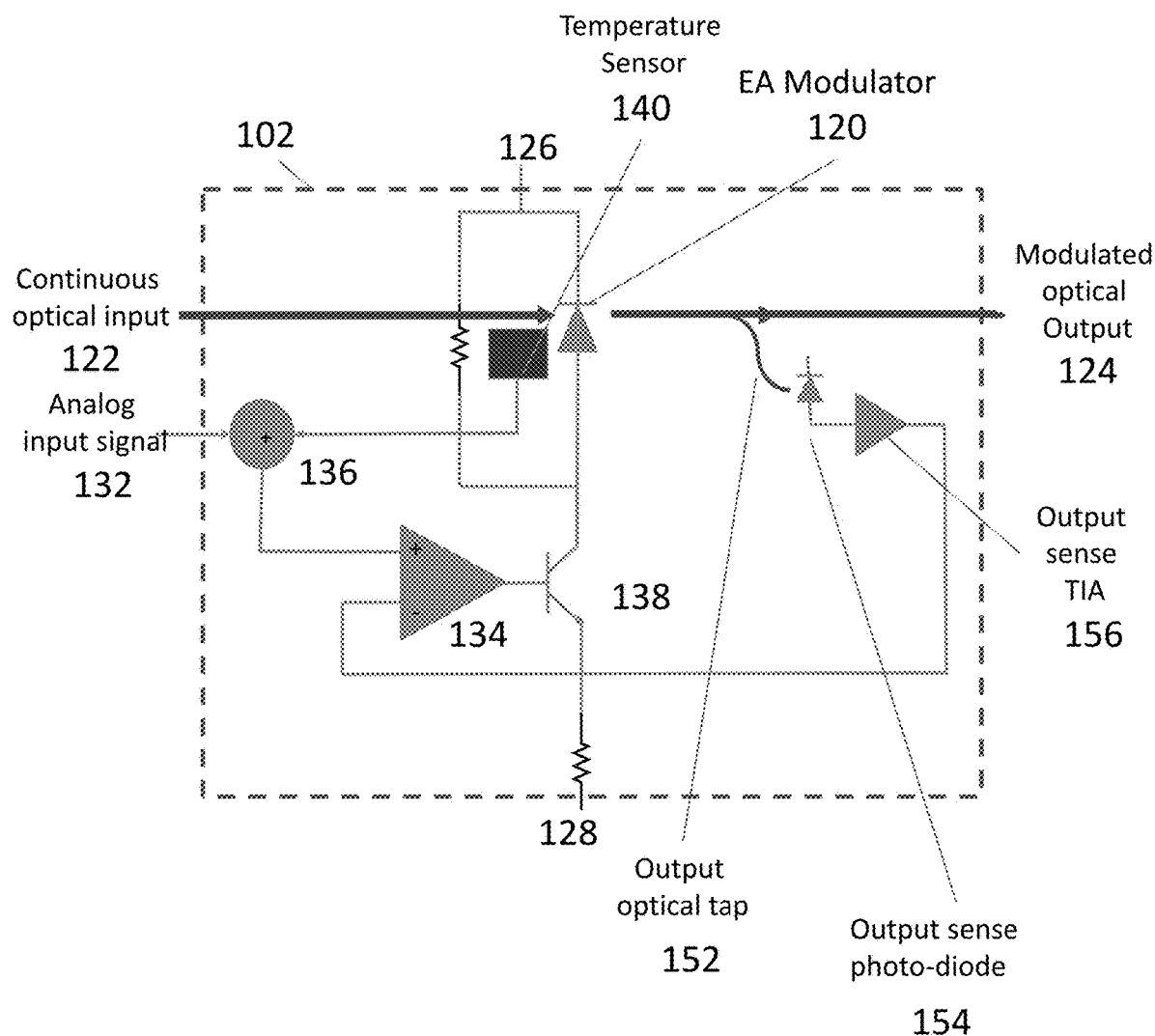
FIG. 16 shows a circuit schematic for a second example of an electro-absorption modulator having monolithically integrated control circuitry for linearization and temperature compensation.

FIG. 15 shows a circuit schematic for a first example of an electro-absorption modulator having monolithically integrated control circuitry for linearization and temperature compensation and FIG. 16 shows a circuit schematic for a second example of an electro-absorption modulator having monolithically integrated control circuitry for linearization and temperature compensation, as disclosed in the related US application nos. U.S. Ser. No. 16/263,169 and U.S. Ser. No. 16/708,887.

Referring to FIG. 15, elements of the electro-photonic integrated circuit 100-1 are monolithically fabricated on a device area 102 of the SI substrate, and comprise the electro-absorption modulator 120 and integrated driver and control circuitry elements. The electro-absorption modulator 120 has an optical input 122 for receiving continuous wave (CW) optical input and an optical output 124 for outputting a modulated optical output. For example, the CW optical input may be provided by a discrete or integrated laser diode (not illustrated) that is coupled to the electro-absorption modulator via an optical waveguide and/or a spot size converter (SSC). The optical output 124 may also comprise a SSC for coupling to other optical components. Electrical terminals 126 and 128 of the electro-optical modulator are provided for applying a reverse DC bias for operation of the electro-absorption modulator 120. An input modulation signal, i.e. an analog electrical signal, provided at control input 132, and fed through elements of the control circuitry to the control terminal drive transistor 138 of the driver circuitry of the electro-absorption modulator 120 for modulation of the optical output signal. The integrated driver and control circuitry form a fast feedback control loop, comprising a first sense means with a first control loop element, with, for temperature compensation and a second sense means with a second control loop element, for linearization of the electro-absorption modulator.

The first sense means operates to detect a temperature of the electro-absorption modulator and generate a first feedback signal dependent on the temperature of the electro-absorption modulator, and a first control loop element operates to combine the first feedback signal and the input analog modulation signal to provide a temperature compensated modulation signal. The first sense means comprises an electrical sensor 140 for detecting a temperature of the electro-absorption modulator and generating a temperature dependent bias voltage. The temperature dependent bias voltage is fed to control circuit element 136 where it is combined with the input modulation signal to generate a temperature compensated modulation signal. The temperature sensor generates a DC bias which is dependent on the temperature of the modulator, and which is applied to adjust the analog input signal to compensate for temperature changes.

Preferably, the electrical temperature sensor placed in close proximity to the electro-absorption modulator and the first control loop element for combining comprises a coupler 136 for adding the first feedback signal, e.g. a temperature dependent bias voltage, to the input analog modulation signal to provide a temperature compensated modulation signal.

The second sense means comprises electrical circuitry 150 for detecting the output level of the electro-absorption modulator, e.g. an electrical photocurrent sense element for detecting the absorbed photocurrent of the electro-absorption modulator and generating the second feedback signal, dependent on the output level of the electro-absorption modulator. The second control loop element comprises a differential amplifier 134 for combining the second feedback signal and the temperature compensated modulation signal to provide a linearized modulation signal. That is, the temperature compensated modulation signal is input to a non-inverting input of the differential amplifier and the second feedback signal is input to an inverting input of the differential amplifier, to generate an error voltage from the difference between the two signals. Thus, the fast feedback control circuitry measures the output optical signal and compares that to the electrical input signal driving the block. The error voltage is generated from the difference between the two signals and is fed to the driver.

Referring to FIG. 16, many elements of the circuit 100-2 are similar to those of the circuit 100-2 of the first example and are labelled with the same reference numerals. Temperature sensor 140 provides for temperature compensation as described for circuit 100 shown in FIG. 15. The fast feedback circuitry shown in FIG. 16 differs from that shown in FIG. 15 in that it comprises electro-optic circuitry for measuring the output optical signal level. That is, the fast feedback circuitry comprises optical tap 152, output sense photo-diode 154 and output sense transimpedance amplifier (TIA) 156 to measure the output optical signal and provide the second feedback signal to the differential amplifier 134. That is, as in the electro-absorption modulator 100-1, the temperature compensated modulation signal is input to a non-inverting input of the differential amplifier and the second feedback signal is input to an inverting input of the differential amplifier, to generate an error voltage from the difference between the two signals which is fed to the driver.

The two embodiments with integrated EAM driver described above differ in the way the feedback measurement of output light is done, i.e. they comprise different forms of output monitor (second sense means) for detecting an output level of the EAM. The first embodiment shown in FIG. 15 uses the absorbed photo-current to measure the output level. The second embodiment shown in FIG. 16 taps off a small amount of the output optical signal, and detects it using a high-speed photo detector and a TIA. In each case, the feedback circuit measures the output optical signal and compares that to the electrical input signal driving the block. The error voltage is generated from the difference between the two signals and is fed to the driver. In both implementations, the first sense means comprises a temperature sensor, which is placed in close proximity to the modulator. In this way a DC bias is generated that sets the bias dependent on the temperature of the modulator.

For small form factor, low-cost and relatively short reach applications, such as 400 G data center interconnects, when the driving electronics and the EAM are integrated into a sufficiently small device area, it is possible to eliminate the matched impedance strip-line drive circuit and the associated power loss. Monolithic integration of the optical modulator and the associated driver and control electronics places the components in closer proximity and significantly reduces the lengths of conductive interconnect tracks, e.g. from millimeters to microns. This approximate 1000:1 reduction in distances that electrical signals must travel, dramatically reduces phase and time delays between blocks thus enabling a fast feedback circuit of either electronic or electro-optic form to be implemented, even at very high speeds. The feedback approach can linearize the overall transfer function of the modulator as well as closely monitor the temperature of the modulator and apply the appropriate temperature dependent bias voltage to keep the operating range of the modulator properly centered.

The monolithic integration reduces the scale of interconnect to microns and this fact, combined with very high-speed transistors, a drive circuit can be implemented that uses feedback to linearize the electro-optical transfer function of the modulator within a limited range of input electrical signals and input optical signals. When operating within this range, the input Continuous Wave (CW) light signal can be linearly modulated allowing advanced modulation schemes, such as QPSK (Quadrature Phase Shift Keying), PAM-4 (4-level Pulse Amplitude Modulation) or even QAM (Quadrature Amplitude Modulation), to be applied to the optical signal. For limited reach applications, such as data center interconnect where the path losses and impairments due to dispersion are limited, complex analog modulation of the light signal can be implemented effectively within a limited dynamic range, while providing good error rate performance across the link. This allows a significant reduction in complexity, cost and power of the link by using simpler building blocks such as an EA modulator and its associated integrated analog electronics, to replace more complex assemblies of Mach-Zehnder modulators, strip line packaging and DSPs to implement the transmitter.

Figure 17:
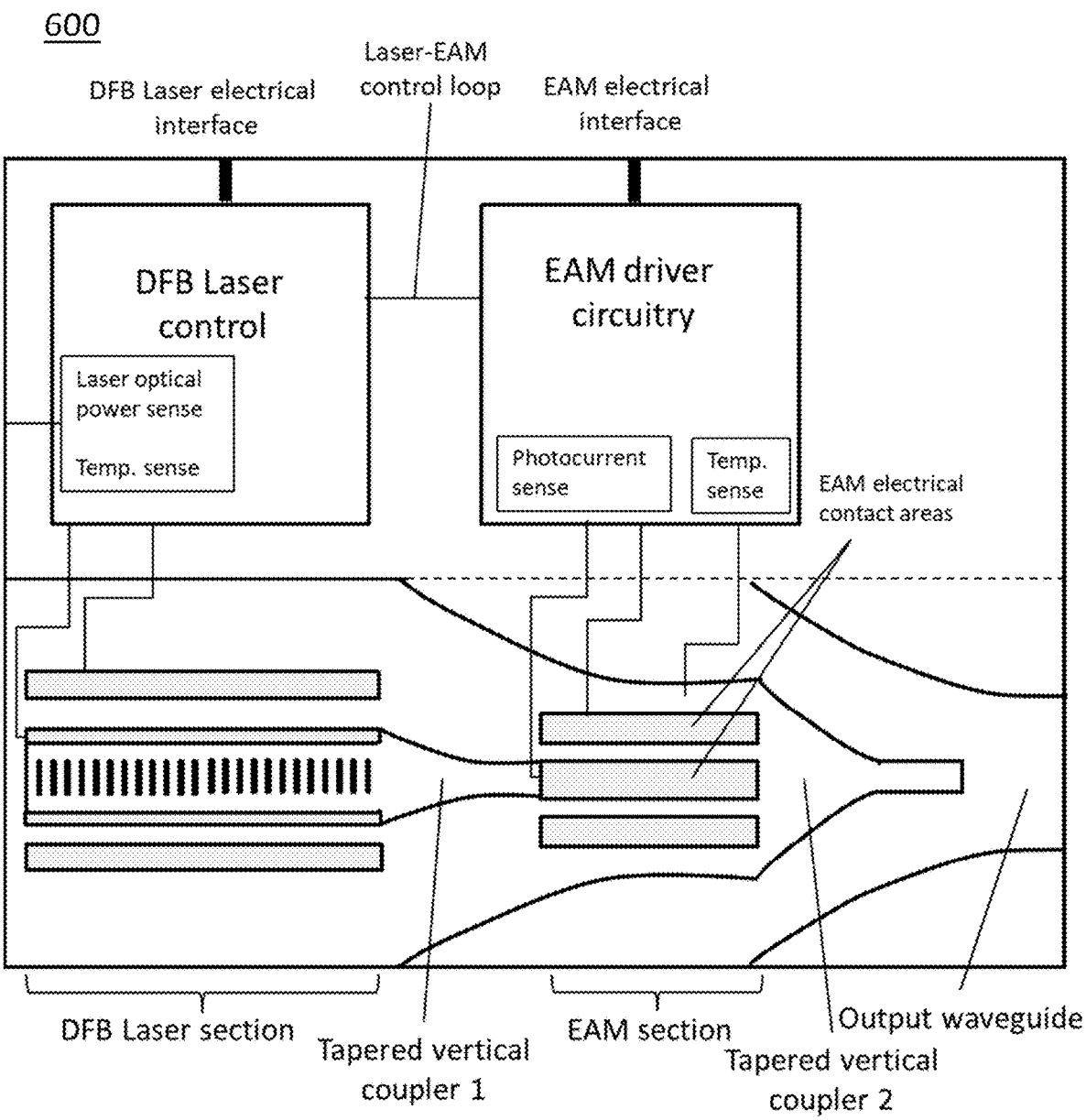
FIG. 17 shows a schematic plan view of an integrated EML of a sixth embodiment, comprising monolithically integrated driver and control electronics.

FIG. 17 shows a schematic plan view of an integrated EML 600 of a sixth embodiment comprising integrated driver circuitry, e.g. comprising integrated EAM driver and control circuitry as illustrated in FIG. 15. Many elements of FIG. 17 are similar to those illustrated schematically in FIG. 10. The schematic plan view in FIG. 17 shows schematically how the photocurrent sense and temperature sense of the integrated EAM driver and control circuitry of FIG. 15 may be incorporated into the device layout.

Figure 18:
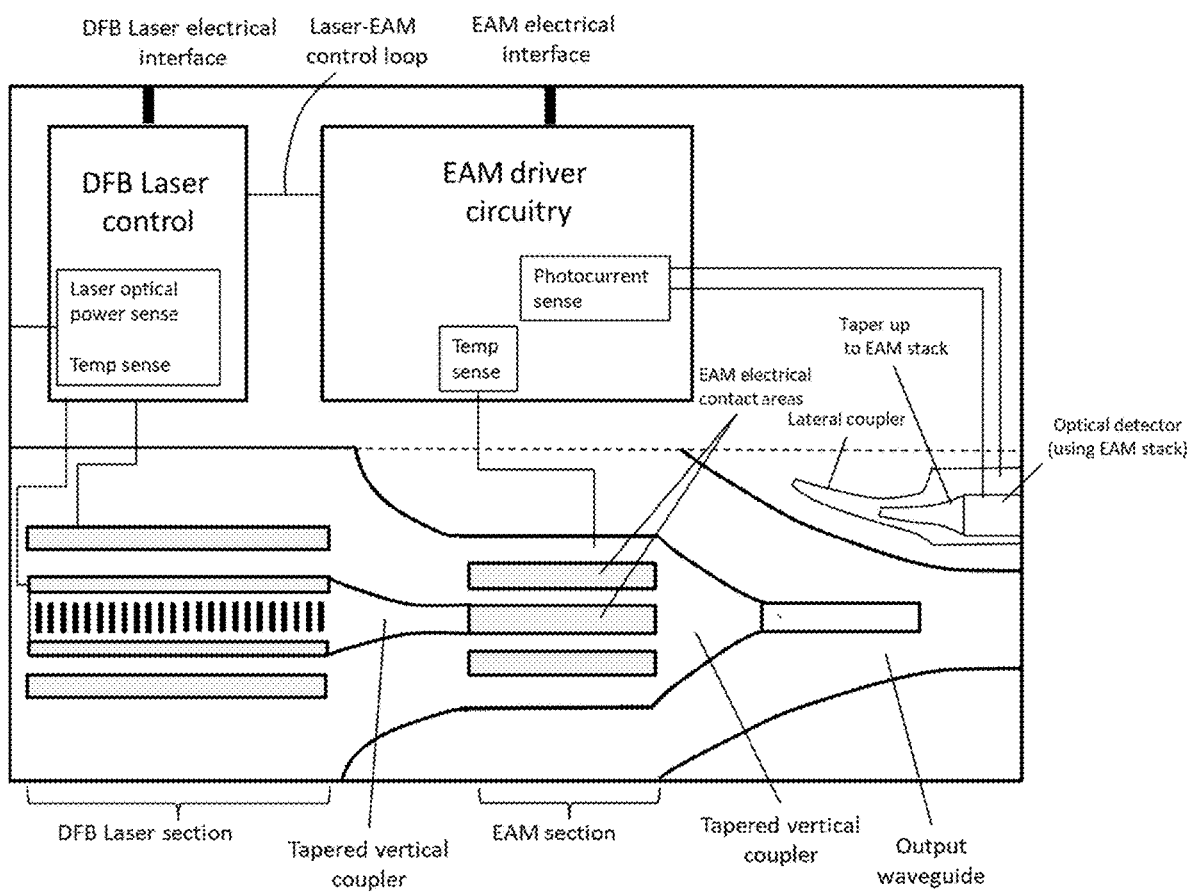
FIG. 18 shows a schematic plan view of an integrated EML of a seventh embodiment, comprising monolithically integrated driver and control electronics.

FIG. 18 shows a schematic plan view of an integrated EML 700 of a seventh embodiment with integrated driver circuitry, e.g. integrated EAM driver and control circuitry as illustrated in FIG. 16. In this embodiment, the waveguide layers of the epi-layer stack near the optical output waveguide are patterned to provide optical tap: i.e. layers of the second level waveguide are patterned as represented schematically in FIG. 18, to define an optical detector, i.e. using active layers of the EAM waveguide stack, and underlying the first level waveguide is patterned to form a lateral optical coupler, configured to tap a small percentage, e.g. 1% of the modulated optical output, which is coupled by another laterally tapered vertical optical coupler to the optical detector.

Monolithically integrated EML of some exemplary embodiments have been described by way example. In each of the exemplary embodiments, vertical integration of a DFB laser and EAM through laterally tapered vertically optical couplers, based on MGVI fabrication, provides for integration of these components in a device structure that may provide increased reliability compared to conventional butt-coupling of a DFB laser and EAM. As mentioned in the background section, it is recognized that a directly- or indirectly-butt-coupled interface between a DFB laser and EAM results in an interface with high stress and strain, which may result in reliability issues, or premature failure, particularly under higher power operation. The structure of the laterally-tapered vertical optical couplers of the EML of the exemplary embodiments provides efficient vertical optical coupling between the output DFB laser and the input of the EAM. The epi-layer structure for the vertically integrated waveguides for the DFB laser and EAM can be designed to reduce stress/strain between the optical components, and the vertically integrated EML avoids a high stress/strain interface region between a conventionally butt-coupled a DFB laser and EAM.

As illustrated by the example embodiments, a vertically integrated EML may be fabricated with or without integrated driver and control electronics. Advantageously, at least the EAM driver and control electronics are also vertically integrated into the device structure, e.g. to optimize interconnect from the driver to the EAM, e.g. reduce interconnect length/inductance/resistance, etc., to enable reliable, higher performance modulation of the EAM, e.g. PAM4. The DFB laser is operated in CW mode, so close proximity of the laser driver and control electronics may not be as important, but optionally the integrated electronic circuitry includes a laser driver. Optionally, other electrical and optical components, e.g. a temperature sensor, optical detector for power monitoring, et al., may be monolithically integrated, as appropriate.

The device topology, i.e. physical layout over the device area, of the optoelectronic components and the electronic circuitry may be selected to optimize interconnect, improve thermal dissipation, make efficient use of the device area, et al. Thus, where feasible, various elements of the EML of the exemplary embodiments may be combined to provide additional or alternative embodiments. For example, the vertically integrated EML of the first embodiment, without integrated driver and control circuitry and described with reference to FIGS. 6 and 7, may be mounted on substrate with discrete driver and control circuitry. For example, a vertically integrated EML of another embodiment may comprise integrated EAM driver and control circuitry, e.g. as described for the EML of the embodiments described with reference to FIGS. 9 and 10, integrated with other optical components and/or electronic circuitry.

Implementation of vertically integrated EML of exemplary embodiments, and variants and modifications thereof, may be achieved using a III-IV based semiconductor materials system. In particular, an InP based semiconductor material system may be used, e.g., comprising selected binary, ternary and quaternary compositions of In, Ga, As, P and
Al. An InP based material system can be used to fabricate passive optical components, e.g. a passive waveguide, optoelectronic device structures such waveguides for the DFB laser and EAM, and can also be used for high-speed electronic circuitry comprising InP transistors, e.g. InP HBTs.

In summary, monolithically integrated EML and methods of fabrication are disclosed, which comprise vertically stacked waveguides for a DFB laser, EAM and a passive output waveguide. The DFB laser, EAM and output waveguide are optically coupled using laterally tapered vertical optical couplers. The passive output waveguide may also be used to provide an optical tap, e.g. for output power monitoring. If required, the third level waveguide for the DFB laser may also be structured to provide a diode detector for back facet power monitoring.

Vertical integration using laterally tapered vertical optical coupler provides an alternative to conventional butt-coupling of a laser and EAM, potentially offering improved reliability for high power operation over extended lifetimes. Availability of higher power lasers enables use of receivers comprising lower cost, higher reliability PIN diode detectors in place of higher sensitivity avalanche photodiodes.

Optionally, the vertically integrated EML comprises monolithically integrated electronic circuitry, e.g., driver and control electronics for the DFB laser and EAM. Beneficially, integrated EAM driver and control circuitry comprises a high speed electro-optical control loop for very high-speed linearization and temperature compensation, e.g. to enable advanced modulation schemes, such as PAM-4 and DP-QPSK, for analog optical data center interconnect applications.

EML of example embodiments are compatible with fabrication using a single epitaxial growth. When multiple epitaxial growths are required, with etch processes in between, etch damage and defects at interface, such as dislocations, may create failure points.

A process using single epitaxial growth, using vertically coupled waveguides, has the advantage that the electric connections and the optical connections are made through virgin crystalline material, and etching through active regions is avoided. This reduces risk of creating defects that act as failure points. For example, in butt-coupled EML using multiple epitaxial growths, it is observed that the butt-coupled interface between the laser diode and the modulator is a common failure point, leading to early-life failure.

In the near future, it is expected that there will be a significantly increased demand for 400 Gb/s optical links, which are being made and shipped in limited quantities. 400 G links are currently implemented by using 4×100 Gb/s per lane or channel, e.g. 4 parallel single mode channels or 4 channels with wavelength multiplexing. Alternatively, to compensate for EAM deficiencies, DSP processing power can be added to provide more complex encoding schemes, e.g. PAM-N, to increase bandwidth, e.g. 56 Gb/s PAM-4. In future years it is expected that demand will increase for 800 Gb/s optical links, and eventually 1.6 Tb/s optical links. For these speeds directly modulated lasers are too slow, and EAM for modulation of cw laser diodes and integrated EML offer a solution. However, significant improvements to the performance of EAM and EML are needed to meet future requirements.

For example, for current requirements for 400 G, it is desirable that an EAM has a −3 dB bandwidth of ≥40 GHz. At the time of filing of the parent application, commercially available EAM fall short of this requirement and typically provide a −3 dB bandwidth of 37 GHz to 38 GHz. Another consideration is that a 50Ω termination for impedance matching causes a 50% voltage drop across the laser diode, resulting in power loss and reduced efficiency.

Recent testing of EAM, and vertically integrated EML of example embodiments fabricated using InP semiconductor technology on SI substrates has demonstrated astonishingly fast response. For example, FIG. 19 shows a schematic plot of bandwidth vs. frequency for a vertically integrated EML of an example embodiment fabricated on a SI substrate. The bandwidth is flat out to 43 db and the −3 dB bandwidth is between 70 GHz and 90 GHz.

Using a highly doped conductive substrate to provide a large back-side contact introduces parasitic capacitance. It is believed that the fabrication of an EAM or EML on a semi-insulating (SI) substrate, e.g. Fe-doped InP contributes substantially to the increased −3 dB bandwidth, because the non-conductive substrate significantly reduces the junction capacitance, potentially by half compared with a conductive p-doped InP substrate.

FIG. 20 shows a table to compare features of 1. a conventional EML using multiple-growth and butt-coupling of a laser diode and EAM and 2. a vertically coupled EML of an example embodiment.

The data in the second column of the table in FIG. 20 are for a commercially available 400 G EML using multiple-growth and butt-coupling of a laser diode and EAM. These are fabricated on a conductive heavily doped n++ InP substrate using a multiple epitaxial growth process. This means that the electrical path and the optical path passes through etched and re-grown materials. Since the device is fabricated on a conductive substrate, which provides a large backside contact, there is no isolation of the laser diode and the EA, and it is not possible There is no ability to integrate the driver electronics. Test results demonstrated a speed, (3 dB bandwidth) in the range of 30 GHz to 38 GHz, and an extinction ratio of ~6 dB to 7 dB. During testing of the butt-coupled lasers and EAM, there was a high incidence of early-life failure and the point of failure was the butt-coupled interface. This failure is believed to be caused by a high density of defects at the interface.

The data in the third column of the table in FIG. 20 are for a vertically coupled EML of an example embodiment, fabricated using a single epitaxial growth process on a SI InP substrate. In this structure, since etching and regrowth is avoided, in a structure fabricated using a single growth, the electrical path and optical path are made through a virgin crystalline structure, which reduces risk of defects, such as dislocations, which act as failure points. This structure provides high reliability, and no instances of early-life failure were observed. The SI substrate allows for the laser diode to be electrically isolated from the EAM, and provides a high breakdown voltage which allows for higher drive voltage levels. The SI substrate provides low capacitance. The low capacitance leads to very high speed operation, with a speed (3 dB bandwidth) of 70 GHz to 90 GHz and an extinction ration of >7 dB. This is very good for high speed modulation such as 112 G PAM-4 (224 Gb/s). The high extinction ratio is important to reduce transmission error rates and meet transmission error rate requirements for high speed modulation. Since the laser diode is electrically isolated, a negative bias supply can be eliminated, and this allows for differential drive. The ability to integrate drive electronics on the SI substrate reduces power consumption, and improves costs and yields.

For practical applications, there is a trade-off of various parameters. Increasing termination resistance to 50Ω drops the bandwidth but the extinction ratio goes up. Since a –3 dB bandwidth of 70 GHz to 90 GHz exceeds requirement for 400 Gb/s, there is an opportunity to increase the termination resistance to increase the extinction ratio. For example, one option is to find a termination resistance that optimizes the extinction coefficient, while offsetting power reduction.

Another consideration is thermal dissipation. Thermal conductivity of a SI InP substrate is lower than the thermal conductivity of an n-doped InP substrate. So another trade-off is thermal resistance, which can be managed by providing suitable thermal management, e.g. a heat-spreader, cooling, thinning of the substrate and transfer/bonding to a thermally conductive substrate to provide a suitable thermally conductive sub-mount. The thermally conductive substrate may a material such as, aluminum oxide, aluminum nitride or other thermally conductive ceramic material, with a suitable coefficient of thermal expansion (CTE). Alternatively the EML may be mounted up-side down, flipped and bonded to a thermal substrate for heat dissipation. Or part of the substrate may be etched away to allow for insertion of a thermal slug or thermally conductive inlay.

Vertically integrated EML of example embodiments have been described in detail, based on a vertically-coupled waveguides fabricated with a single growth process and surface etched gratings. Fabrication on an SI substrate with vertically coupled waveguides using a single epitaxial growth process, allows for integration of driver and control electronics, for reduced interconnect resistances, inductances and other parasitic capacitances, resistances and inductances. It is also observed that an SI substrate significantly improves performance of both the laser diode and EAM, e.g. due to reduced device capacitance.

Since fabrication of a vertically coupled EAM on a SI substrate significantly improves performance, it is also believed that integration of a laser diode and an EAM fabricated on a SI substrate, e.g. using conventional multiple epitaxial growths and regrown/buried grating structures, and conventional side-by-side butt-coupling of a laser and EAM, would also provide improved performance relative to fabrication on a conductive doped substrate. This is because in a conventional structure, the doped conductive substrate and large backside contact introduces significant parasitic capacitance.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A monolithically integrated electro-absorption modulated laser (EML) comprising:
a semi-insulating (SI) substrate;
an epitaxial layer structure comprising a plurality of semiconductor layers grown on the SI substrate;
the epitaxial layer structure defining a plurality of vertically stacked optical waveguides, wherein:
a first level waveguide comprises layers structured as an output waveguide;
a second level waveguide comprises layers structured as an electro-absorption modulator (EAM) waveguide;
a third level waveguide comprises layers structured as a distributed feedback (DFB) laser waveguide;
layers of the third level waveguide are patterned to define a laser mesa comprising a DFB
laser cavity having a surface etched grating (SEG), and a first laterally tapered vertical optical coupler extending from an optical output of the DFB laser cavity;
layers of the second level waveguide are patterned to define a mesa of the EAM, and a second laterally tapered vertical optical coupler extending from an optical output of the EAM;
layers of the first level waveguide are patterned to provide an output waveguide;
the DFB laser cavity is laterally spaced from the EAM along the direction of optical propagation, the first laterally tapered vertical optical coupler being structured to couple an emitted optical mode from the DFB laser to an input of the EAM; and
the second laterally tapered vertical optical coupler being structured to vertically couple a modulated output from the EAM to the output waveguide;
first electrical connections to the DFB laser for operating the DFB laser in CW mode; and
second electrical connections for driving the EAM.

2. The integrated EML of claim 1, wherein the SI substrate is Fe-doped InP and the EML is fabricated from an InP based material system, comprising selected binary, ternary and quaternary compositions of In, Ga, As, P and Al.

3. The integrated EML of claim 1, further comprising a passive waveguide vertically disposed under the first level waveguide and patterned to form a spot size converter (SSC); the first level waveguide comprising a third laterally tapered vertical optical coupler structured to couple the optical output from the output waveguide to the SSC for coupling to a single mode optical fiber.

4. The integrated EML of claim 1, wherein,
the epitaxial layer structure comprises a plurality of semiconductor layers for electronic circuitry underlying the plurality of vertically stacked optical waveguides, the semiconductor layers for electronic circuitry being vertically separated from the plurality of vertically stacked optical waveguides by at least one spacer layer;
the optical components comprising the DFB laser waveguide, EAM waveguide, output waveguide, and the laterally tapered vertical optical couplers being formed on a first area of the SI substrate;
the electronic circuitry being formed on a second area of the SI substrate, adjacent the first area, where semiconductor layers of the epitaxial layer structure comprising the at least one spacer layer and all overlying layers have been removed; and
interconnect metallization providing electrical interconnections between the electronic circuitry and the first electrical connections of the DFB laser and the second electrical connections of the EAM, for operating the DFB laser and driving the EAM.

5. The integrated EML of claim 4, wherein the electronic circuitry comprises EAM driver and control circuitry for linearization and temperature compensation, comprising one of:
an electrical photocurrent sensor for monitoring optical output of the EAM and an electrical temperature sensor for monitoring an operating temperature of the EAM; and
an optical tap and a photodetector for monitoring optical output of the EAM and an electrical temperature sensor for monitoring the operating temperature of the EAM.

6. The integrated EML of claim 5, wherein
the EAM has first and second electrical terminals for applying a bias voltage for operating the EAM and an electrical control terminal for receiving an input analog modulation signal which is fed through the control circuitry to a drive transistor of the EAM driver;
and wherein the control circuitry comprises: a first sense means for detecting a temperature of the EAM and generating a first feedback signal dependent on the temperature of the EAM and first control loop element for combining the first feedback signal and the input analog modulation signal to provide a temperature compensated modulation signal; a second sense means for detecting an output level of the EAM and generating a second feedback signal dependent on the output level of the EAM and a second control loop element for combining the second feedback signal and the temperature compensated modulation signal to provide a linearized modulation signal.

7. The integrated EML of claim 6, wherein the first sense means for detecting a temperature of the EAM comprises an electrical temperature sensor placed in close proximity to the EAM and the first control loop element comprises a coupler for adding the first feedback signal to the input analog modulation signal to provide the temperature compensated modulation signal.

8. The integrated EML of claim 6, wherein the first feedback signal comprises a temperature dependent offset bias.

9. The integrated EML of claim 6, wherein the second sense means comprises electrical components for detecting a photocurrent of the EAM and generating the second feedback signal;
or
wherein the second sense means comprises electro-optical components comprising an optical tap, for sampling an optical output of the EAM, a photodetector and a transimpedance amplifier for generating the second feedback signal.

10. The integrated EML of claim 6, wherein the second control loop element for combining the second feedback signal and the temperature compensated modulation signal comprises a differential amplifier, and the temperature compensated modulation signal is input to a non-inverting input of the differential amplifier and the second feedback signal is input to an inverting input of the differential amplifier, to generate an error voltage from the difference between the two signals, which is fed to the EAM driver.

11. The integrated EML of a claim 6, wherein lengths of electrically conductive interconnect tracks between the EAM driver and control circuitry and the EAM are in the range of microns to tens of microns, to reduce timing delays and phase delays.

12. The integrated EML of claim 1, wherein the DFB laser is a vertically-coupled surface-etched-grating (VC-SEG) DFB laser.

13. The integrated EML of claim 1, wherein the epitaxial layer structure is compatible with a single epitaxial growth process.

14. The integrated EML claim 1, fabricated with III-V semiconductor materials.

15. The integrated EML of claim 1, fabricated with an InP based material system, comprising selected binary, ternary and quaternary compositions of In, Ga, As, P and Al.

16. A method of fabricating a monolithically integrated electro-absorption modulated laser (EML) of claim 1, wherein a DFB laser is vertically integrated with an EAM by a laterally tapered vertical optical coupler, comprising:
providing a semi-insulating (SI) substrate;
growing on the SI substrate an epitaxial layer structure, the epitaxial layer structure comprising a plurality of vertically stacked optical waveguides, wherein:
a first level waveguide comprises layers structured as a passive output waveguide;
a second level waveguide comprises layers structured as an EAM waveguide;
a third level waveguide comprises layers structured as a DFB laser waveguide;
patterning layers of the third level waveguide to define a laser mesa comprising a DFB laser cavity having a surface etched grating (SEG), and a first laterally tapered vertical optical coupler extending from an optical output of the laser cavity;
patterning layers of the second level waveguide to define a mesa of the EAM, and a second laterally tapered vertical optical coupler extending from an optical output of the EAM;
patterning layers of the first level waveguide to define the passive output waveguide;
the DFB laser cavity being laterally spaced from the EAM along the direction of optical propagation, and the first laterally tapered vertical optical coupler being structured to couple an emitted optical mode from the DFB laser cavity to an input of the EAM; and the second laterally tapered vertical optical coupler being structured to vertically couple modulated output from the EAM to the passive output waveguide;
and
providing first electrical connections to the DFB laser for operating the DFB laser in CW mode and providing second electrical connections to the EAM for driving the EAM.

17. A method of fabricating a monolithically integrated electro-absorption modulated laser (EML), wherein a distributed feedback (DFB) laser is vertically integrated with an electro-absorption modulator (EAM) and integrated electronic circuitry, comprising:
providing a semi-insulating (SI) substrate;
growing a blanket epitaxial layer structure on first and second areas of the SI substrate, the first area being designated for optical components of the EML and the second area being designated for electronic circuitry;
the blanket epitaxial layer structure comprising:
a first plurality of semiconductor layers for fabrication of electronic circuitry;
at least one spacer layer comprising a selective etch stop; and
a plurality of vertically stacked optical waveguides, wherein:
a first level waveguide comprises layers structured as a passive output waveguide;
a second level waveguide comprises layers structured as an EAM waveguide;
a third level waveguide comprises layers structured as a DFB laser waveguide;
protecting the first area and selectively removing from the second area the plurality of vertically stacked optical waveguides and the at least one spacer layer;
processing the first plurality of semiconductor layers to define the electronic circuitry;
protecting the second area comprising the electronic circuitry;
processing the plurality of vertically stacked optical waveguides comprising:
patterning layers of the third level waveguide to define a laser mesa comprising a DFB laser cavity having a surface etched grating (SEG), and a first laterally tapered vertical optical coupler extending from an optical output of the laser cavity;
patterning layers of the second level waveguide to define a mesa of the EAM, and a second laterally tapered vertical optical coupler extending from an optical output of the EAM;
patterning layers of the first level waveguide to define a passive output waveguide;
the DFB laser cavity being laterally spaced from the EAM along the direction of optical propagation, and the first laterally tapered vertical optical coupler being structured to couple an emitted optical mode from the DFB laser cavity to an input of the EAM; and
the second laterally tapered vertical optical coupler being structured to vertically couple modulated output from the EAM to the passive output waveguide;
providing first electrical connections between the electronic circuitry and the DFB laser for operating the DFB laser in CW mode and providing second electrical connections for driving the EAM.

18. The method of claim 17, wherein the EML further comprises a vertically integrated spot size converter (SSC) for coupling an optical output of the EML to a single mode fiber, comprising:
after growing the first plurality of semiconductor layers for fabrication of electronic circuitry and the at least one spacer layer comprising a selective etch stop, and before growing overlying layers of the blanket epitaxial layer structure,
etching a deep trench through said first plurality of semiconductor layers and the at least one spacer layer comprising a selective etch stop, and into the underlying substrate;
growing within the deep trench epitaxial layers for the SSC;
and wherein patterning of the first level waveguide to define an output waveguide further comprises defining a third laterally tapered vertical optical coupler to couple the optical output from the passive output waveguide to the SSC.

* * * * *